US012707631B2

(12) United States Patent
Benson et al.

(10) Patent No.: US 12,707,631 B2
(45) Date of Patent: Aug. 11, 2026

(54) DAMASCENE DIGIT LINES

(71) Applicant: Micron Technology, Inc., Boise, ID (US)

(72) Inventors: Russell A. Benson, Boise, ID (US); Terrence B. McDaniel, Boise, ID (US); Vinay Nair, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 370 days.

(21) Appl. No.: 18/505,462

(22) Filed: Nov. 9, 2023

(65) Prior Publication Data

US 2024/0292603 A1 Aug. 29, 2024

Related U.S. Application Data

(60) Provisional application No. 63/448,846, filed on Feb. 28, 2023.

(51) Int. Cl.
*H10B 12/00* (2023.01)
*H10W 10/00* (2026.01)
*H10W 10/17* (2026.01)

(52) U.S. Cl.
CPC ........... *H10B 12/482* (2023.02); *H10B 12/02* (2023.02); *H10B 12/485* (2023.02); *H10W 10/014* (2026.01); *H10W 10/17* (2026.01)

(58) Field of Classification Search
None
See application file for complete search history.

(56) References Cited

U.S. PATENT DOCUMENTS

| | | | | |
|---|---|---|---|---|
| 7,398,595 | B2 | 7/2008 | Fazan | |
| 9,613,902 | B2 | 4/2017 | Pellizzer | |
| 10,283,703 | B2 | 5/2019 | Pellizzer | |
| 2015/0303209 | A1* | 10/2015 | Park | H10B 43/40 257/316 |
| 2018/0350831 | A1* | 12/2018 | Kim | G11C 11/4099 |
| 2021/0134823 | A1* | 5/2021 | Kang | H10B 43/40 |

* cited by examiner

*Primary Examiner* — Hung K Vu
(74) *Attorney, Agent, or Firm* — Brooks, Cameron & Huebsch, PLLC

(57) ABSTRACT

Systems, methods and apparatus are provided for damascene digit lines. For instance, a damascene digit line can be formed by forming a plurality of dummy digit lines on a semiconductor substrate that are separated by a first set of vertical trenches, depositing a sacrificial insulating material in the first set of vertical trenches, forming, and depositing an insulating fill material in, a second set of vertical trenches, forming, and depositing a nitride material in, nitride material deposition spaces; removing at least a portion of the semiconductor substrate to form plurality of cell contact deposition spaces, forming cell contacts in the cell contact deposition spaces, removing the dummy digit lines to form a plurality of vertical openings, removing nitride material to form expanded vertical opening, depositing a digit line insulating material in the expanded vertical openings to form digit line deposition spaces, and forming digit lines.

15 Claims, 34 Drawing Sheets

DAMASCENE DIGIT LINES

PRIORITY INFORMATION

This Application claims the benefit of U.S. Provisional Application No. 63/448,846, filed on Feb. 28, 2023, the contents of which are incorporated herein by reference.

TECHNICAL FIELD

The present disclosure relates generally to memory devices, and more particularly, to memory devices including damascene digit lines.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by epitaxially grown channel regions. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1A:
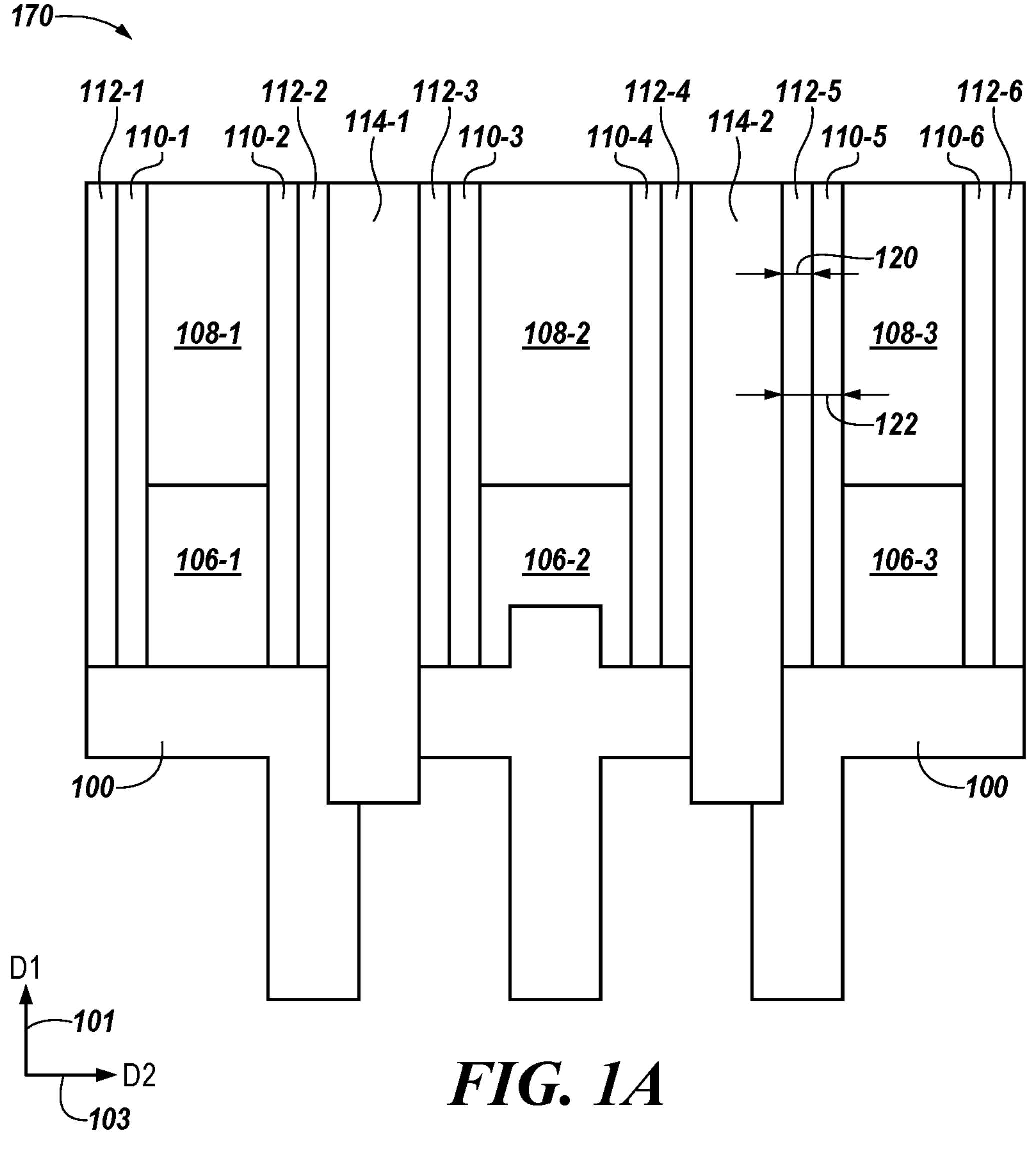
FIG. 1A is a diagram of a cross section of an example of an apparatus in accordance with a number of embodiments of the present disclosure.

Various materials may be deposited using techniques such as chemical vapor deposition (CVD), plasma deposition, etc. The deposited materials can be patterned using techniques such as photolithographic techniques, doping techniques, and/or can be etched using wet and/or dry etching (e.g., vapor) processes to form semiconductor structures. Such semiconductor structures may contain, or be associated with, various materials that contribute to data access, storage, and/or processing, or various support structures, on a memory device. As an example, a capacitor material may be deposited into an opening in a semiconductor structure to permit data access, storage, and/or processing use of the semiconductor structure including the capacitor material.

Semiconductor structures may be formed with vertically oriented digit lines and horizontally oriented access devices and access lines, with cell contacts, to create an array of vertically stacked memory cells. In some approaches, vertically stacked memory cells can be created using a subtractive method. For instance, digit lines can be formed before cell contact formation and spacers can then be formed (e.g., to separate that digit lines and/or cell contacts).

However, such approaches may be complex, may rely on a presence of multiple spacers materials (e.g., three or more spacer materials) and/or may rely on thick (e.g., 3 nm or greater) spacer materials. Due at least to the multiple spacer materials and/or the thick spacer materials such approaches may yield relatively large semiconductor structures and/or may yield semiconductor structures which are prone to defects such as unintended electrical variation at interfaces between the spacer materials and/or interfaces between the interfaces of the spacer material and an adjacent material.

In addition, due to formation of the digit line before the cell contact, such approaches may necessarily expose a digit line material to a high temperature process such as rapid thermal processing (RTP) that are employed with and/or subsequent to cell contact formation. For instance, RTP may heat the semiconductor structure to a temperature exceeding 1000° C. to anneal the semiconductor structure subsequent to cell contact formation. A high temperature process such as RTP may damage digit line materials that are prone to thermal changes such as by causing material degradation. Though the digit line materials may be prone to damage when exposed to high temperature processes, the digit line materials may also have other desirable properties such as lower electrical resistivity.

Accordingly, to address the above-mentioned deficiencies and other deficiencies, the present disclosure is directed to damascene digit lines, as described herein. For example, digit line (e.g., damascene digit line) formation can include: forming a plurality of dummy digit lines on a semiconductor substrate that are separated by a first set of vertical trenches, the dummy digit lines including a dummy digit line coupled to a bit line contact in the semiconductor substrate; depositing a sacrificial insulating material in the first set of vertical trenches; depositing a carbon material on the sacrificial insulating material; removing a portion of the carbon material to form a second set of vertical trenches; depositing an insulating fill material in the second set of vertical trenches; removing the remainder of the carbon material to form a plurality of nitride material deposition spaces; depositing a nitride material in the nitride material deposition spaces; removing at least a portion of the nitride material to form plurality of cell contact deposition spaces extending through the nitride material and at least a portion of the height of the semiconductor substrate; forming cell contacts in the cell contact deposition spaces; removing the dummy digit lines to form a plurality of vertical openings; removing at least a portion of the nitride material to form expanded vertical openings; depositing a digit line insulating material in the expanded vertical openings to form digit line deposition spaces; depositing a digit line material in the digit line deposition spaces to form digit lines; and depositing a cap material on the digit lines.

Thus, as described herein, the resultant apparatuses herein can have digit lines which are formed after cell contact formation, and thus the digit lines can be formed after the structure has been exposed to a high temperature process (e.g., annealing). For instance, a dummy digit line may be removed and replaced with a digit line material after formation of the cell contacts. Thus, while the dummy digit lines may be exposed to the high temperature process, the digit lines (e.g., the final digit lines in the apparatus) are not exposed to the high temperature process. Accordingly, various digit line materials, as described herein, can be employed in the damascene digit lines, including those which would otherwise be prone to defect formation if exposed to RTP or another high temperature process.

Moreover, the resultant apparatuses herein can have a relatively thin insulating material (e.g., thin nitride material layer and/or digit line insulating material layer) and/or can have employ fewer insulating materials (e.g., two or less insulating materials) as compared to other approaches such as those described above. For instance, in some embodiments at least a portion of a sacrificial insulating material and/or nitride material may be removed (e.g., thinned), and a portion may be replaced with a digit line insulating material that is different than the sacrificial insulating material and/or nitride material. Accordingly, an apparatus of the present disclosure may be produced, by removal of at least the portion of the sacrificial insulating material and/or the nitride material, with a digit line insulating material (e.g., an individual spacer of a plurality of spacers) which alone or in combination may be thinner than a thickness of spacers utilized in other approaches. Employing a thinner spacer may reduce a size of resultant memory devices and/or may improve digit line capacitance and/or reduce any electrical leakage, etc. Additionally, in some embodiments an apparatus of the present disclosure may be produced, by replacing all of the first spacer material, with a spacer having a single layer. Employing a single layer spacer may mitigate any defects due to removing or reducing a quantity of spacer-to-spacer interfaces as compared to other approaches such as those which employ more spacers with more spacer to spacer interfaces.

The figures herein follow a numbering convention in which the first digit or digits correspond to the figure number of the drawing and the remaining digits identify an element or component in the drawing. Similar elements or components between different figures may be identified by the use of similar digits. For example, reference numeral 106 may reference element “06” in FIG. 1A, and a similar element may be referenced as 206 in FIG. 2A. Multiple analogous elements within one figure may be referenced with a reference numeral followed by a hyphen and another numeral or a letter. For example, 206-1 may reference element 206-1 in FIG. 2A and 206-2 may reference element 206-2, which may be analogous to element 206-1. Such analogous elements may be generally referenced without the hyphen and extra numeral or letter. For example, elements 206-1 and 206-2 or other analogous elements may be generally referenced as 206.

FIG. 1A is a diagram of a cross section of an example of an apparatus 170 in accordance with a number of embodiments of the present disclosure. The cross section is taken from a side view. As used herein, a side view refers to a cross section along a plane containing a first direction 101, which may be referred to as a vertical plane or vertical direction, and a substantially perpendicular second direction 103, which may be referred to as a horizontal plane or horizontal direction.

The apparatus 170 may include a semiconductor substrate 100, a plurality of cell contacts 114 extending through at least a portion of the height of the semiconductor substrate 100. The apparatus 170 may include a plurality of digit lines 106 with an insulating cap 108 on each digit line 106 of the plurality of digit lines 106. In some embodiments, the digit line material can be tungsten, ruthenium, molybdenum, titanium, tantalum, cobalt, titanium nitride, tantalum nitride, tungsten silicide, cobalt silicide, tantalum silicide, doped silicon, doped germanium, or any combination thereof.

The apparatus 170 may include cell contacts 114. The cell contacts 114 and the digit lines 106 can be separated by a sacrificial insulating material 112 and/or a digit line insulating material 110.

The sacrificial insulating material 112 can be conformally deposited on a vertical sidewall of cell contacts 114, as described herein. The sacrificial insulating material 112 can include a dielectric material with a high dielectric constant (high-k) relative to silicon dioxide, such as a high-k nitride material. in some embodiments, the sacrificial insulating material is formed entirely of (e.g., is only formed of) a metal digit line material.

The sacrificial insulating material 112 may have a thickness 120 extending in a horizontal direction that is greater than or equal to zero nanometers and less than 3 nm. For instance, in some embodiments, the thickness 120 extending in a horizontal direction can be less than 2 nm or less than 1 nm. In some embodiments, the thickness 120 extending in a horizontal direction can be in a range from about 0.1 nm to less than 3.0 nm. In some embodiments, the thickness 120 extending in a horizontal direction can be in a range from about 0.1 nm to about 2.0 nm. In some embodiments, the thickness 120 extending in a horizontal direction can be in a range from about 0.1 nm to about 1.0 nm. However, in some embodiments, the thickness 120 extending in a horizontal direction can be equal to zero (e.g., in embodiments where the entire thickness 120 is removed).

The digit line insulating material 110 can be conformally deposited on the sacrificial insulating material 112, as described herein. (e.g., The apparatus may include a digit line insulating material 110 on the side walls of the sacrificial insulating material 112) The digit line insulating material 110 can include a dielectric material with a low dielectric constant (low-k) relative to silicon dioxide (e.g., a low dielectric constant material). In some embodiments the digit line insulating material 110 can include a low-k dielectric. In some embodiments the digit line insulating material is formed entirely of (e.g., is only formed of) a low-k dielectric. In some examples, the combined thickness 122 of the digit line insulating material 110 and the sacrificial material 112 may be less than 3 nm, less than 2 nm, or less than 1 nm.

Figure 1B:
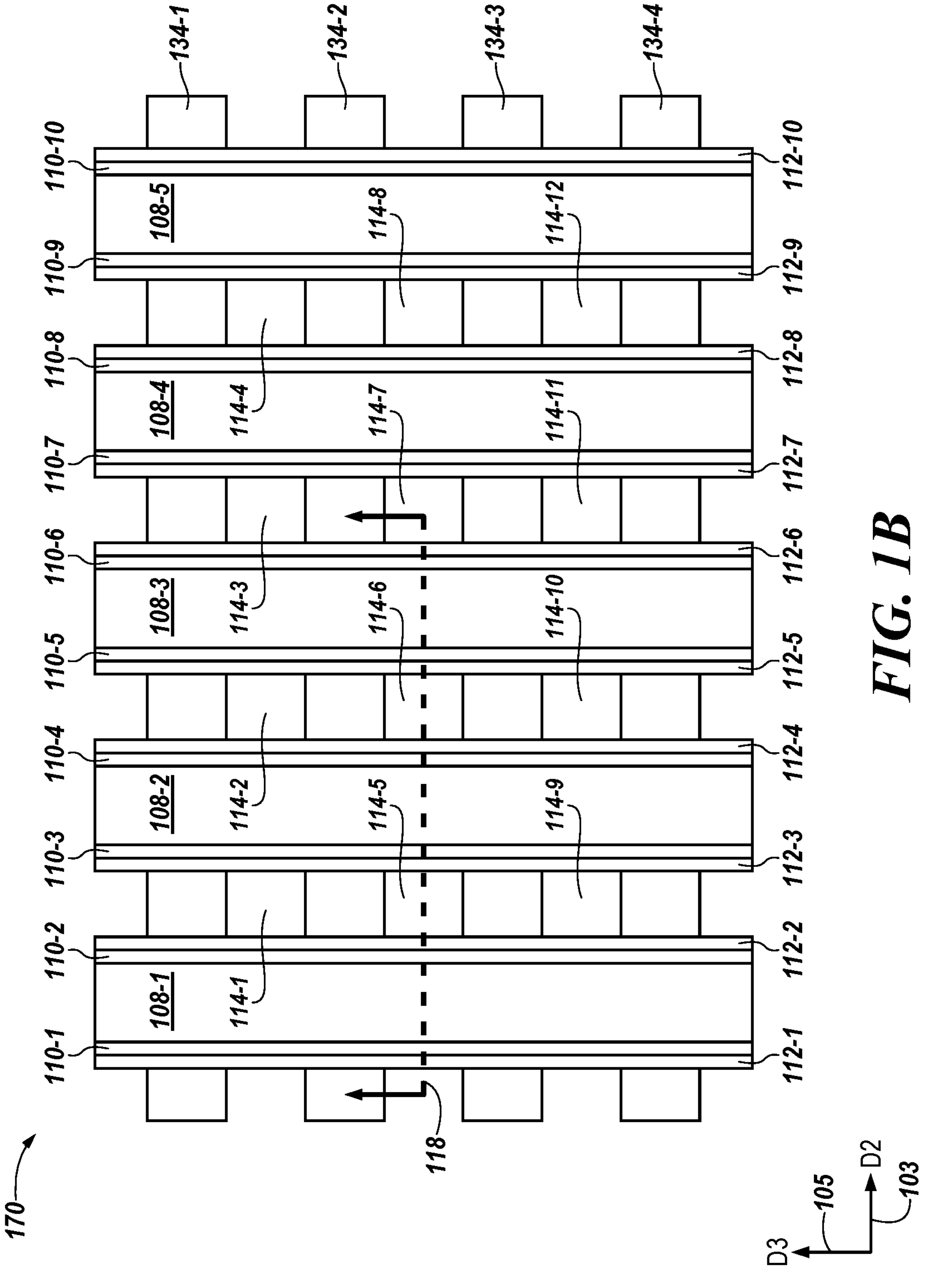
FIG. 1B is a diagram of a cross section of an example of an apparatus in accordance with a number of embodiments of the present disclosure.

FIG. 1B is a diagram of a cross section of an example of the apparatus 170 in accordance with a number of embodiments of the present disclosure. The cross section is taken from a top-down view. As used herein, a top-down view refers to a cross section along a plane containing the second direction 103 and a third direction 105 that is substantially orthogonal to the plane containing the first direction 101 and the second direction 103. The third direction may be referred to as a depth. The top-down cross section depicts the cell contacts 114, the insulating cap 108, the digit line insulating material 110 and the sacrificial insulating material 112, an insulating fill material 134 as well as depicting the cross section location 118 of the cross section depicted by FIG. 1A.

Figure 2A:
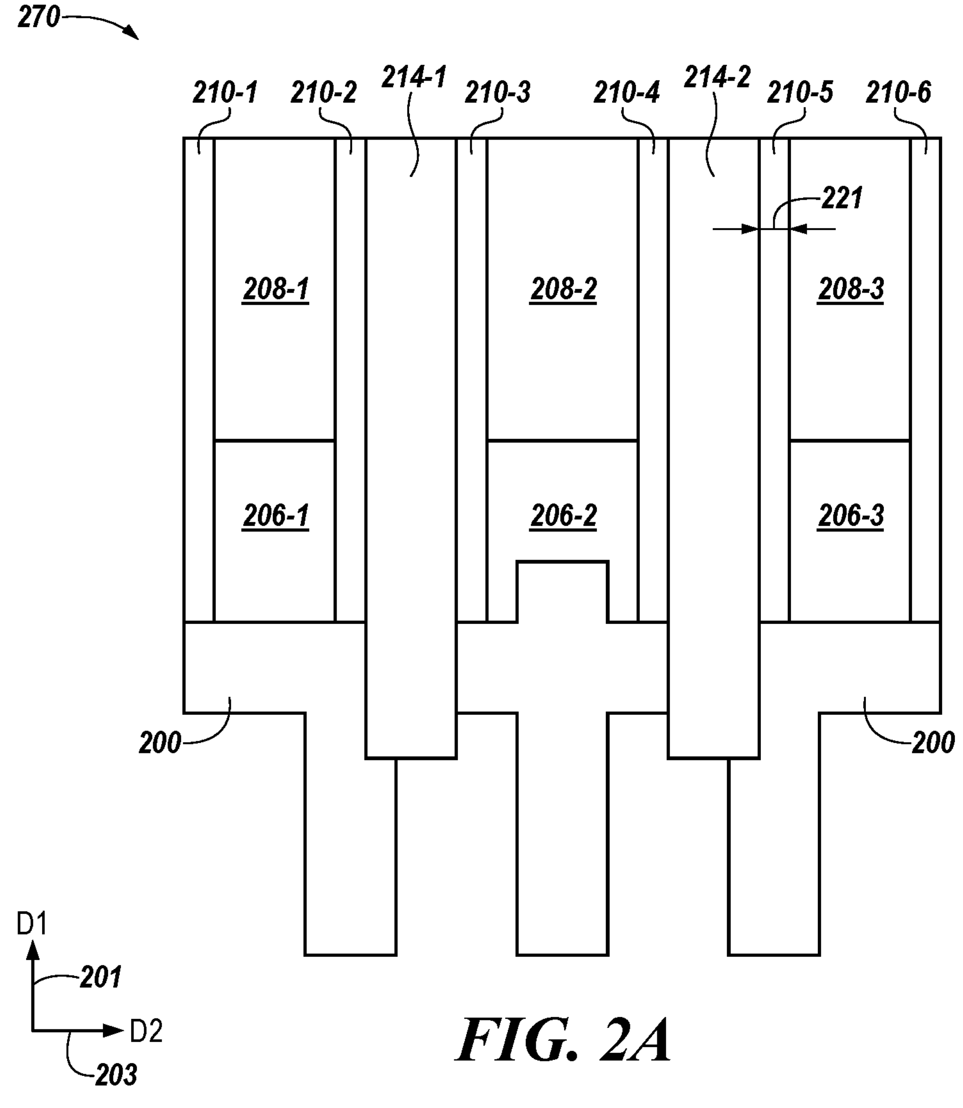
FIG. 2A is a diagram of a cross section of an example of an apparatus in accordance with a number of embodiments of the present disclosure.
Figure 2B:
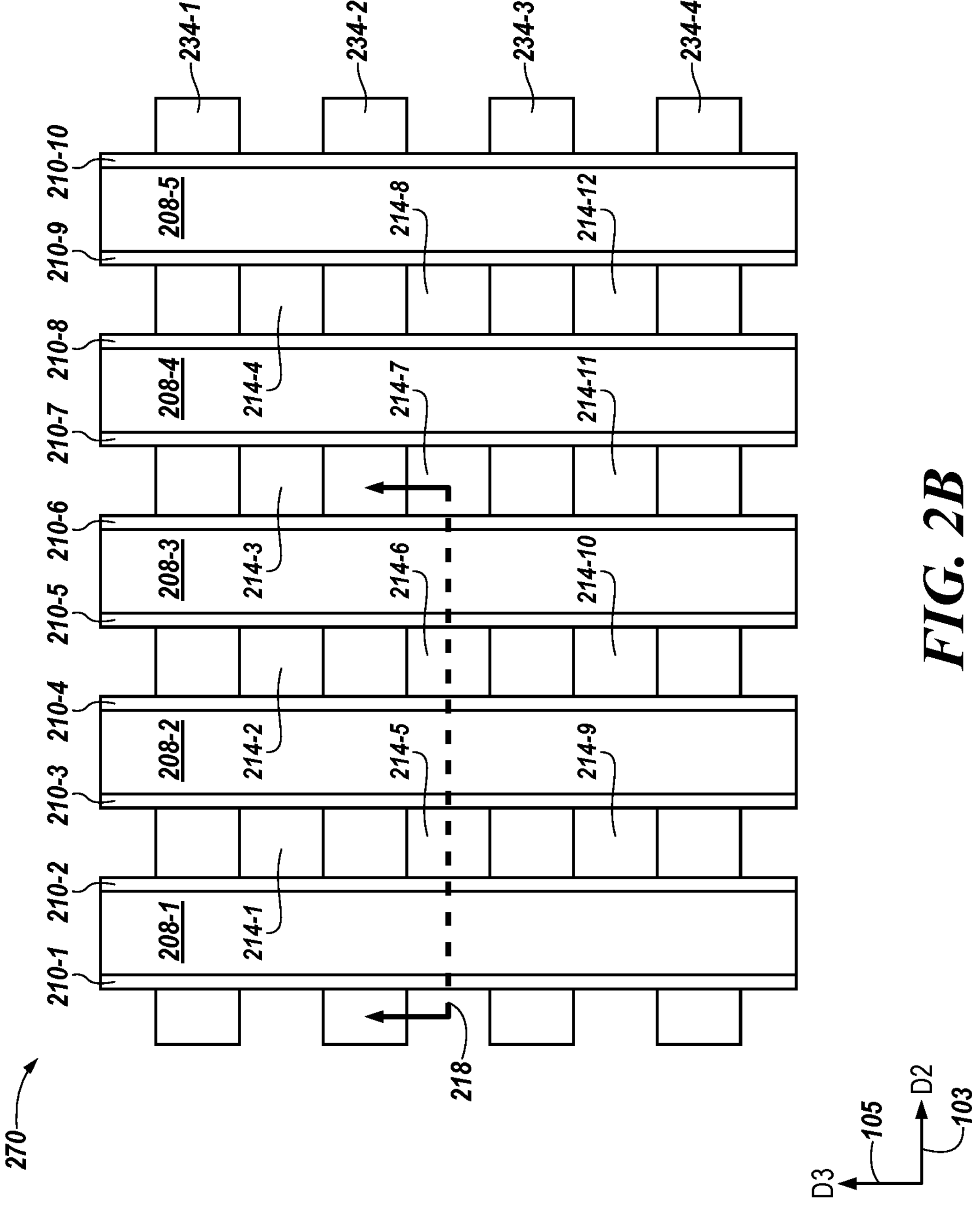
FIG. 2B is a diagram of a cross section of an example of an apparatus in accordance with a number of embodiments of the present disclosure.

FIGS. 2A and 2B are diagrams of side and top-down cross sections, respectively, of an example of an apparatus 270 in accordance with a number of embodiments of the present disclosure in which the thickness 120 of sacrificial insulating material 112 is equal to zero (e.g., the entire thickness 120 of the sacrificial insulating material 112 has been thinned or removed).

Figure 3A:
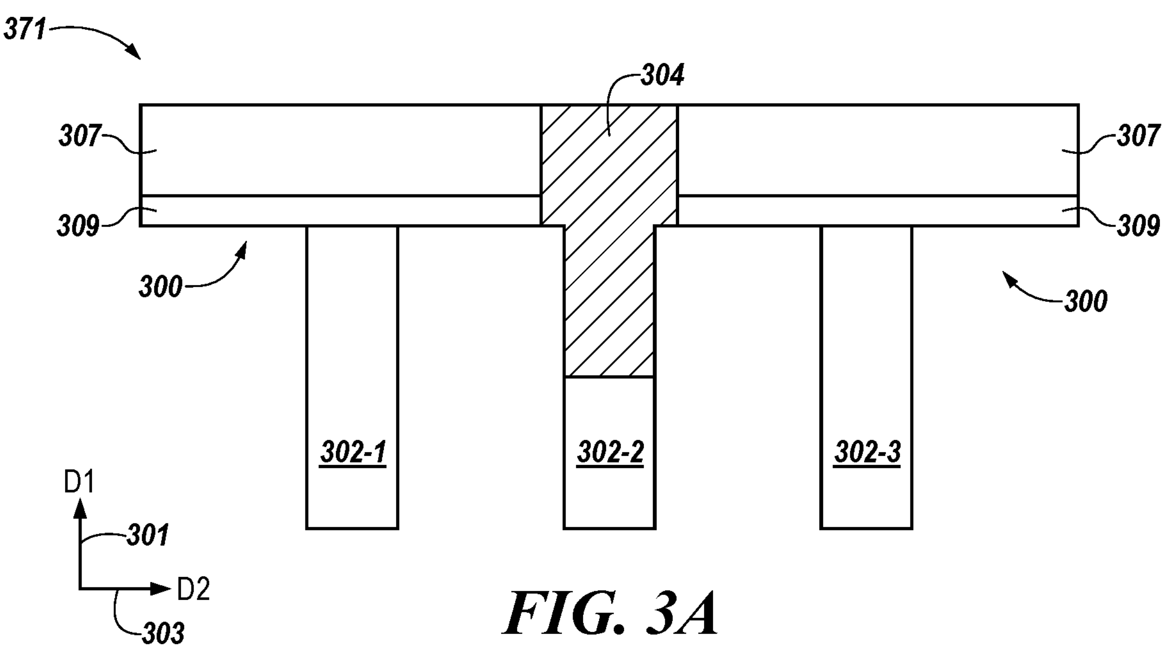
FIGS. 3A-3AD illustrate a number of cross-sectional views of a portion of a semiconductor structure of a memory device in association with a semiconductor fabrication sequence in accordance with a number of examples of the present disclosure.

FIGS. 3A-AD illustrate a number of cross-sectional views of a portion of a semiconductor structure of a memory device in association with a plurality of stages in a semiconductor fabrication sequence in accordance with a number of examples of the present disclosure. The method of semiconductor fabrication depicted can be used, for example, to produce the apparatus 170 of FIGS. 1A and 1B and/or the apparatus 170 of FIGS. 2A and 2B.

Figure 3B:
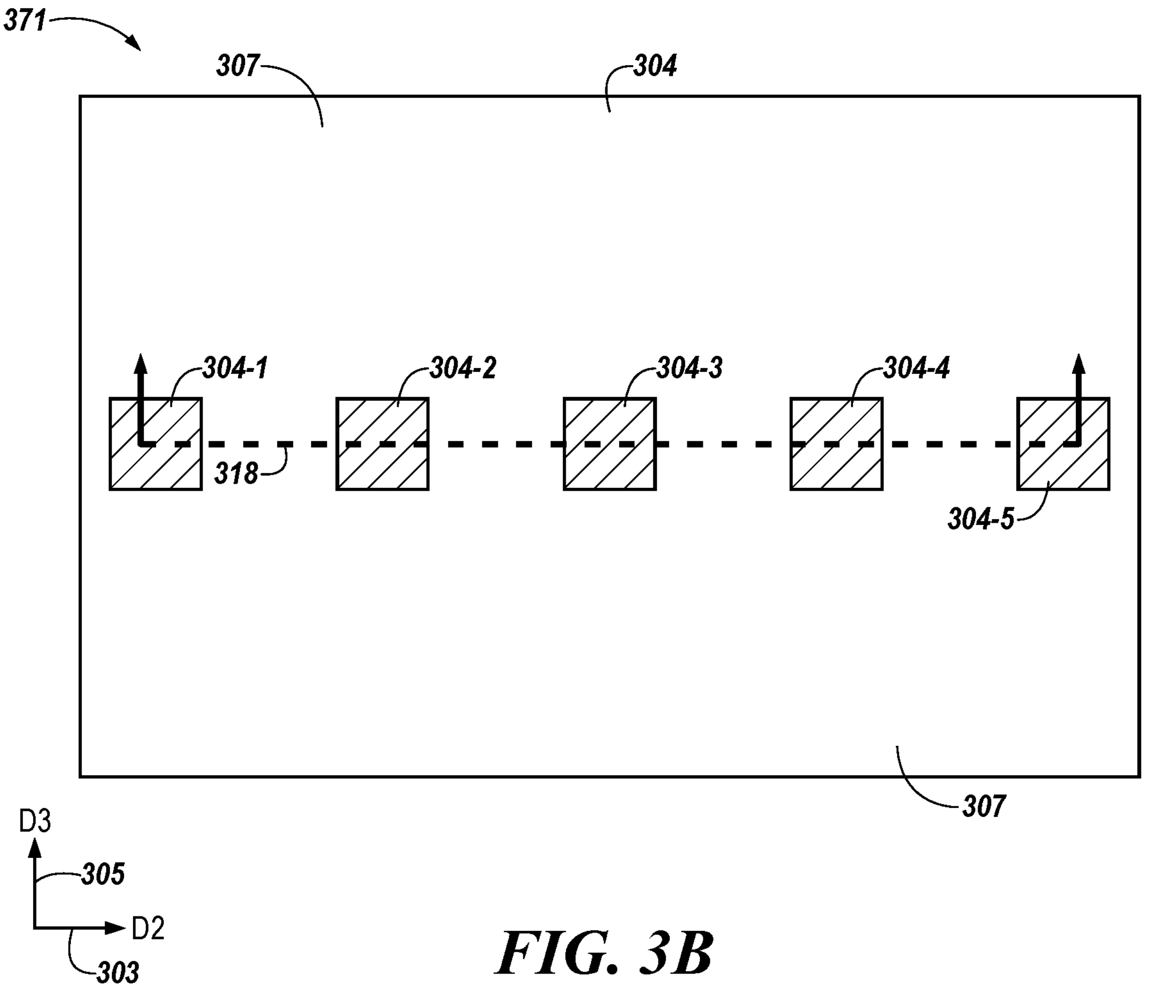

FIGS. 3A and 3B illustrate the side and top-down cross sections, respectively, of a semiconductor structure at one stage of a semiconductor fabrication process 371 in accordance with a number of embodiments of the present disclosure, in which a semiconductor substrate 300 is provided. In some embodiments, the semiconductor substrate 300 may include an insulating base material 307 (e.g., nitride material, a high-k dielectric material, or other insulating material) layered on an interlayer dielectric 309, a bit line 302, and a bit line contact 304 (e.g., a titanium nitride (TiN) plug).

Figure 3C:
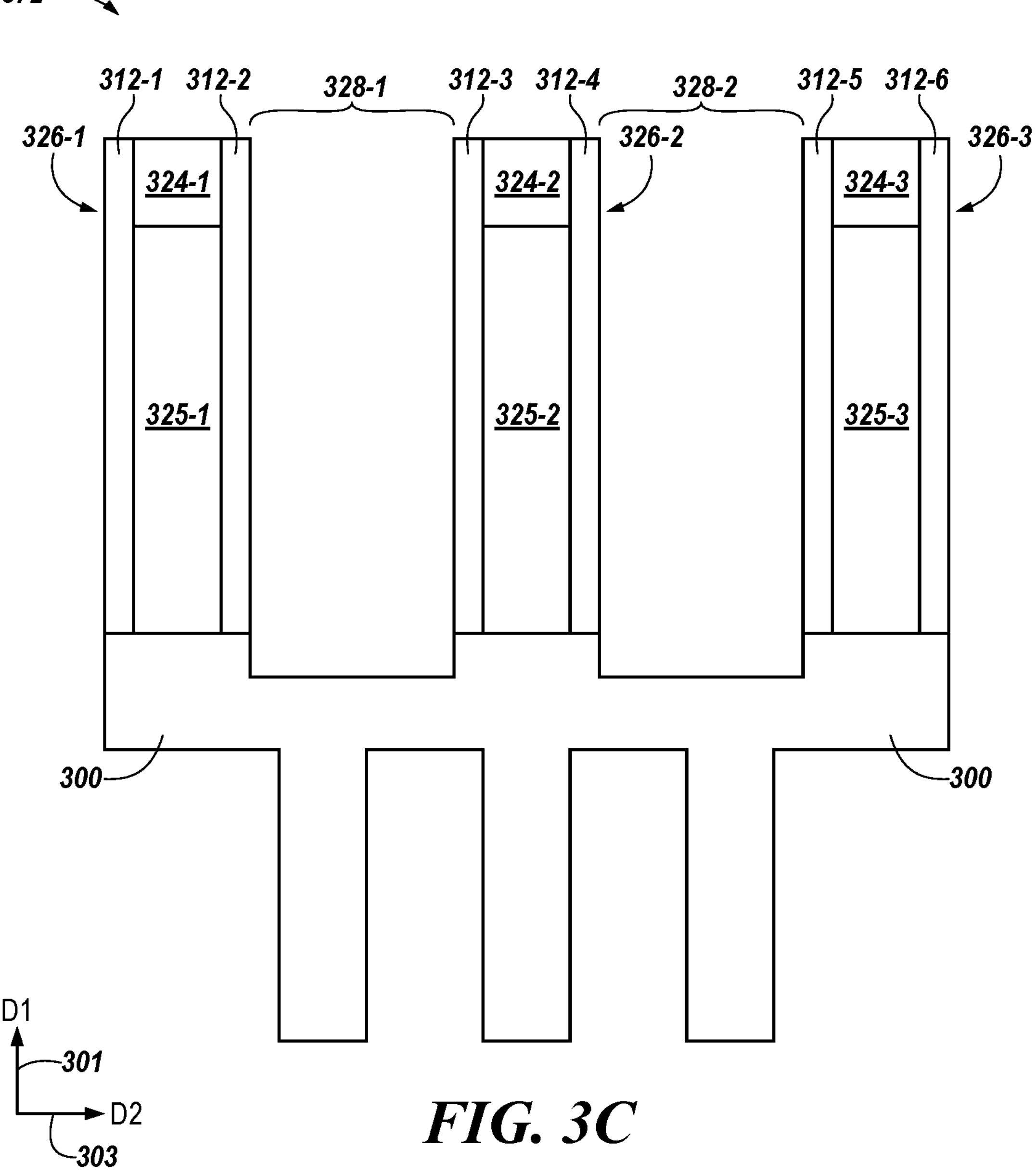
Figure 3D:
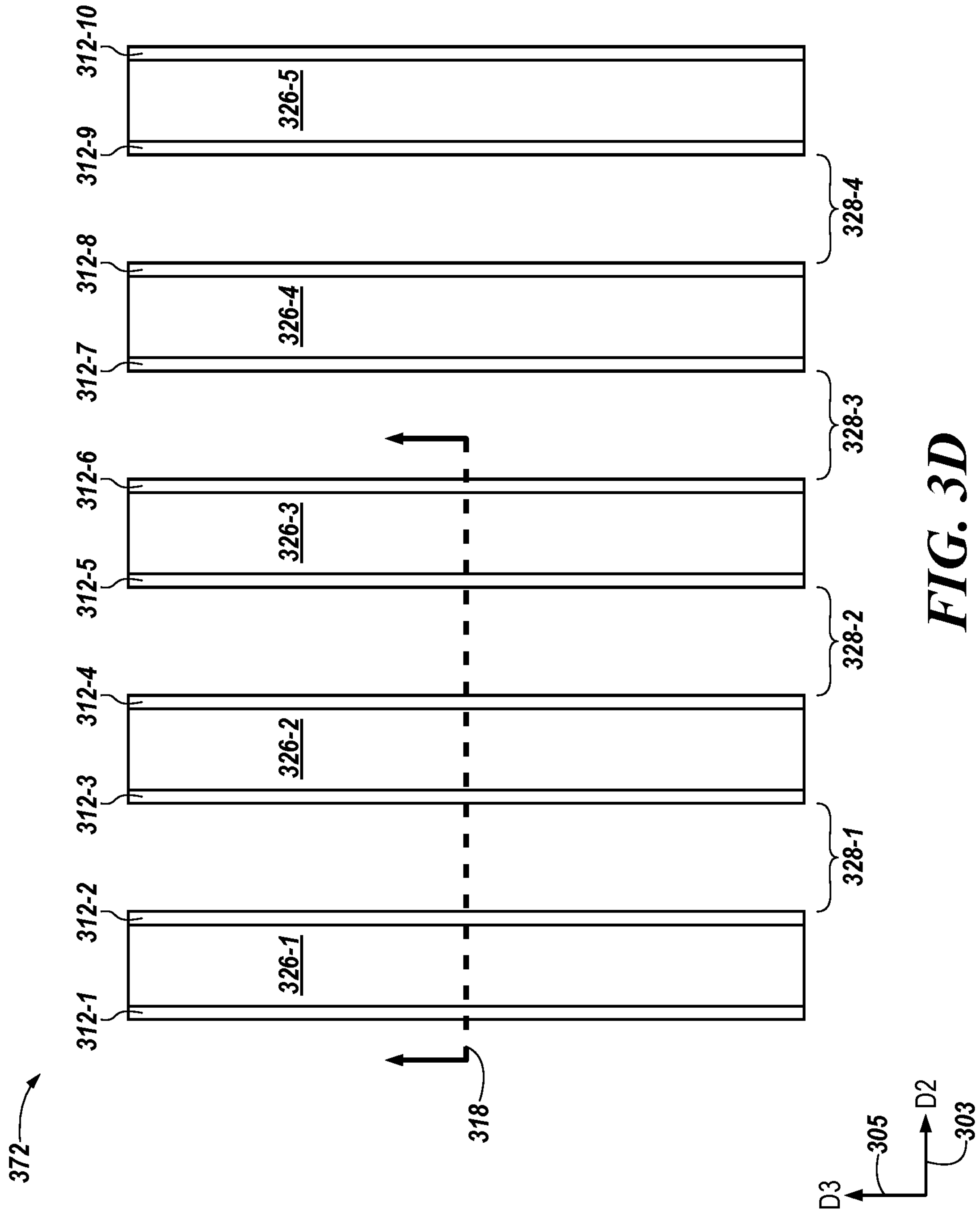

FIGS. 3C and 3D illustrate the side and top-down cross sections, respectively, of a semiconductor structure at one stage of a semiconductor fabrication process 372 in accordance with a number of embodiments of the present disclosure. FIGS. 3C and 3D illustrate the result of the stage in which a plurality of dummy digit lines 326, separated by a first set of vertical trenches 328, may formed on the semiconductor structure at one stage of a semiconductor fabrication process 371 of FIGS. 3A and 3B. The dummy digit lines 326 may be formed by depositing a silicon material 325, depositing a temporary capping material 324, and removing a portion of the silicon material 325 to shape the dummy digit lines 326. A sacrificial insulating material 312 may be deposited in the first set of vertical trenches 328. In some embodiments, the sacrificial insulating material 312 may be conformally deposited on the vertical side walls of the dummy digit lines 326. However, other deposition mechanisms for the sacrificial insulating material (and similarly the other insulting materials) are possible.

Figure 3E:
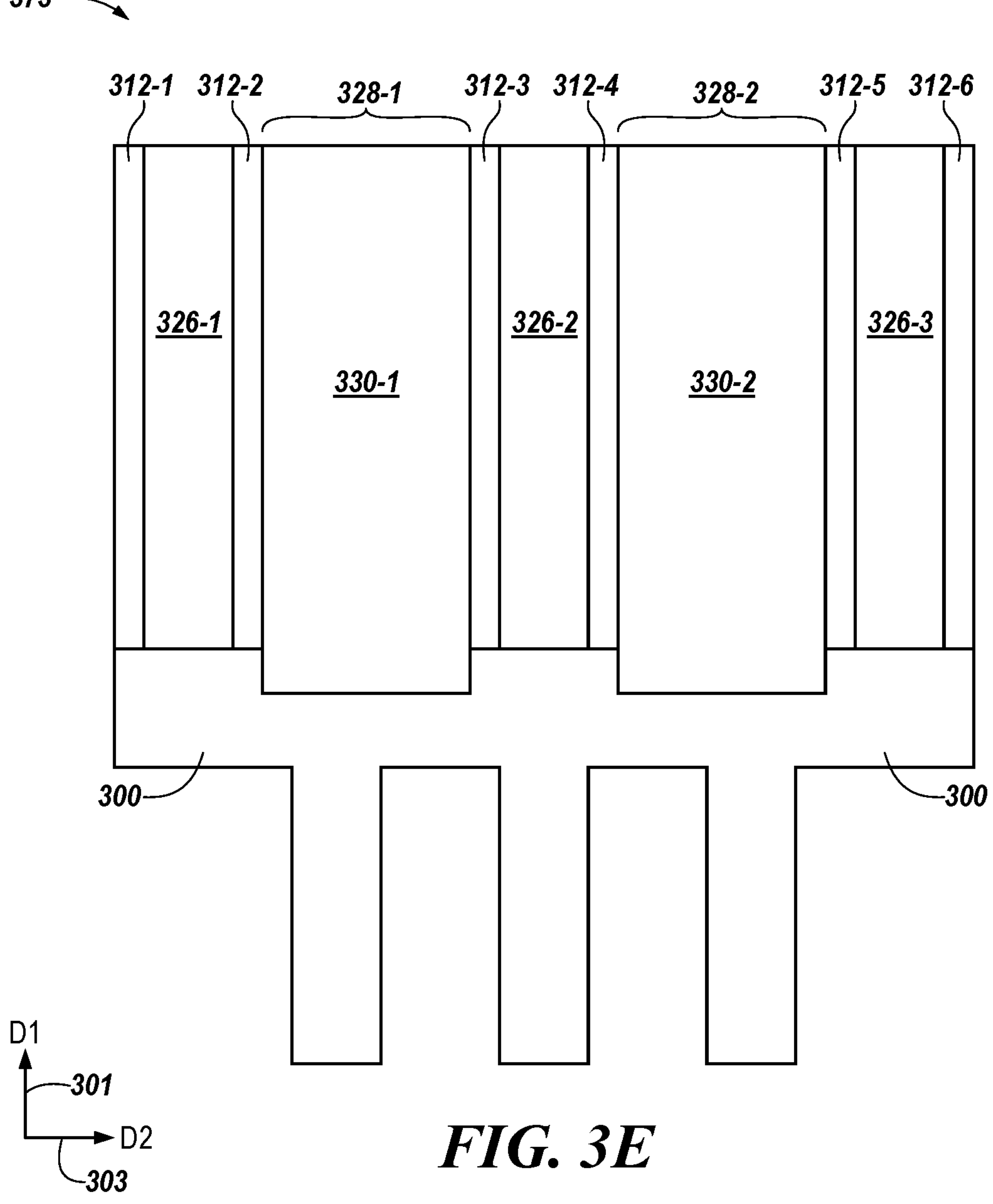
Figure 3F:
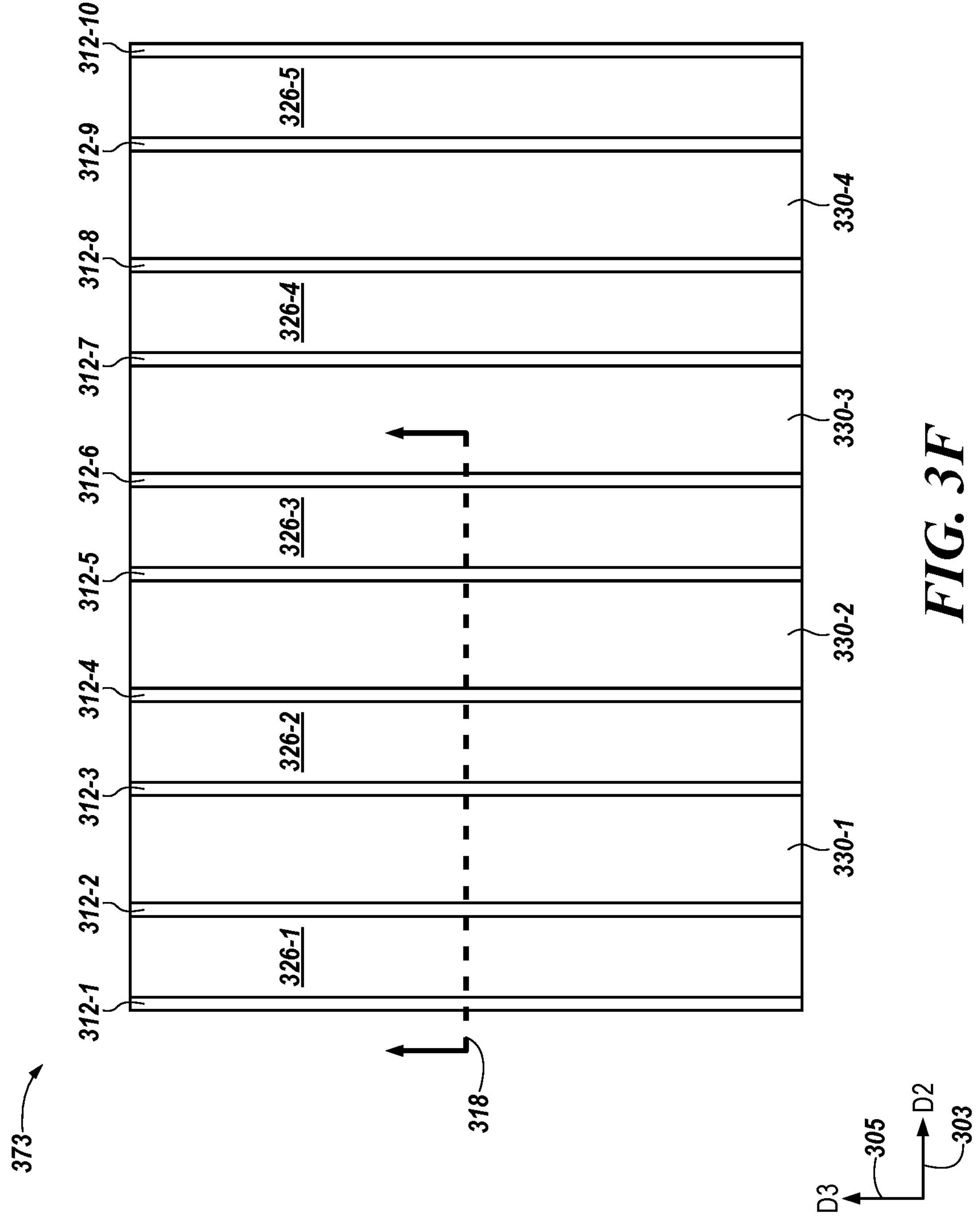

FIGS. 3E and 3F illustrate the side and top-down cross sections, respectively, of a semiconductor structure at one stage of a semiconductor fabrication process 373 in accordance with a number of embodiments of the present disclosure. FIGS. 3E and 3F illustrate the result of the stage in which a carbon material 330 may be deposited in the first set of vertical trenches 328 of the semiconductor structure at one stage of a semiconductor fabrication process 372 of FIGS. 3C and 3D. For example, a gap fill carbon method or spin on carbon method may be used to deposit a carbon material 330 on the semiconductor structure at one stage of a semiconductor fabrication process 372, among other possible deposition methods.

Figure 3G:
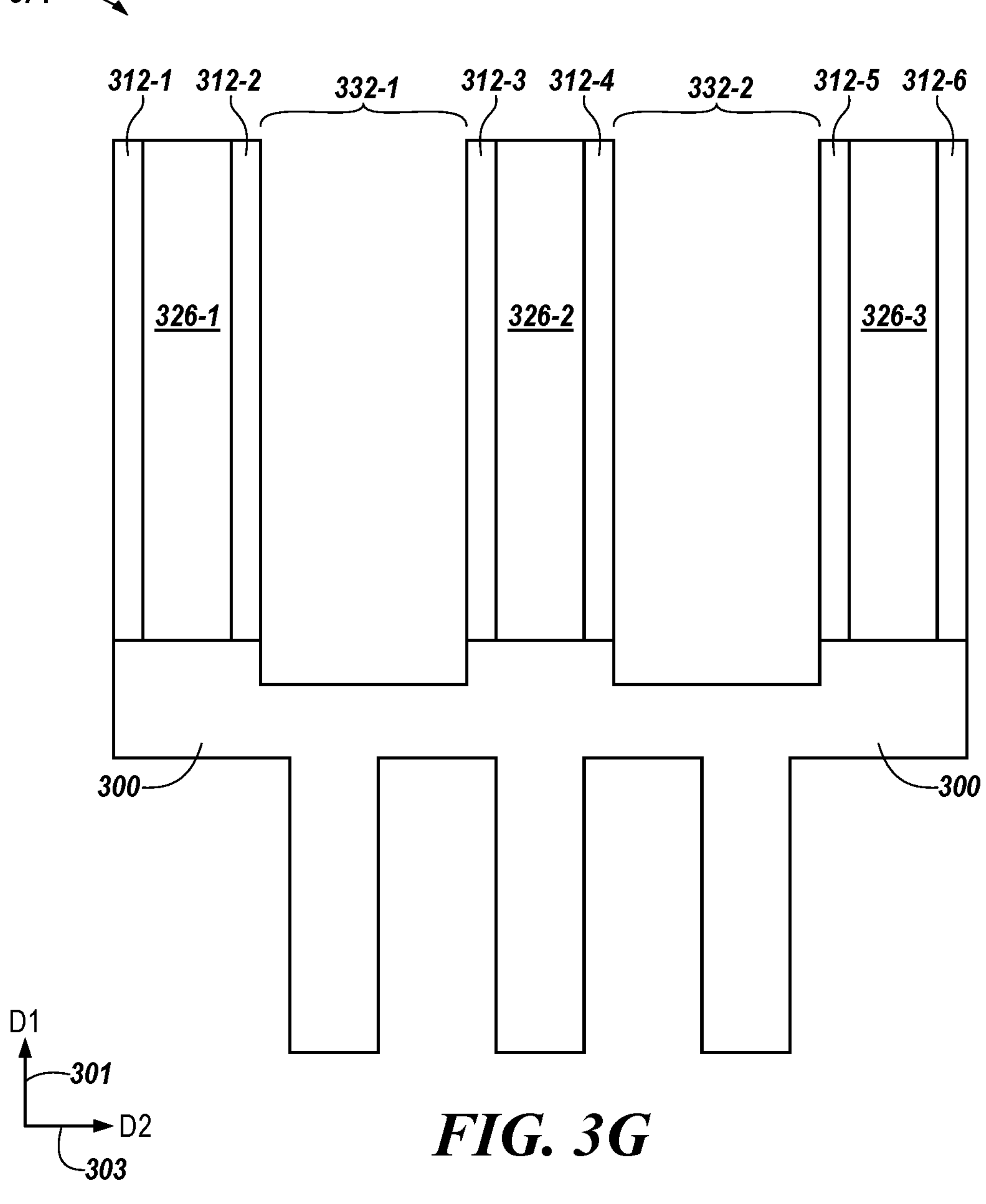
Figure 3H:
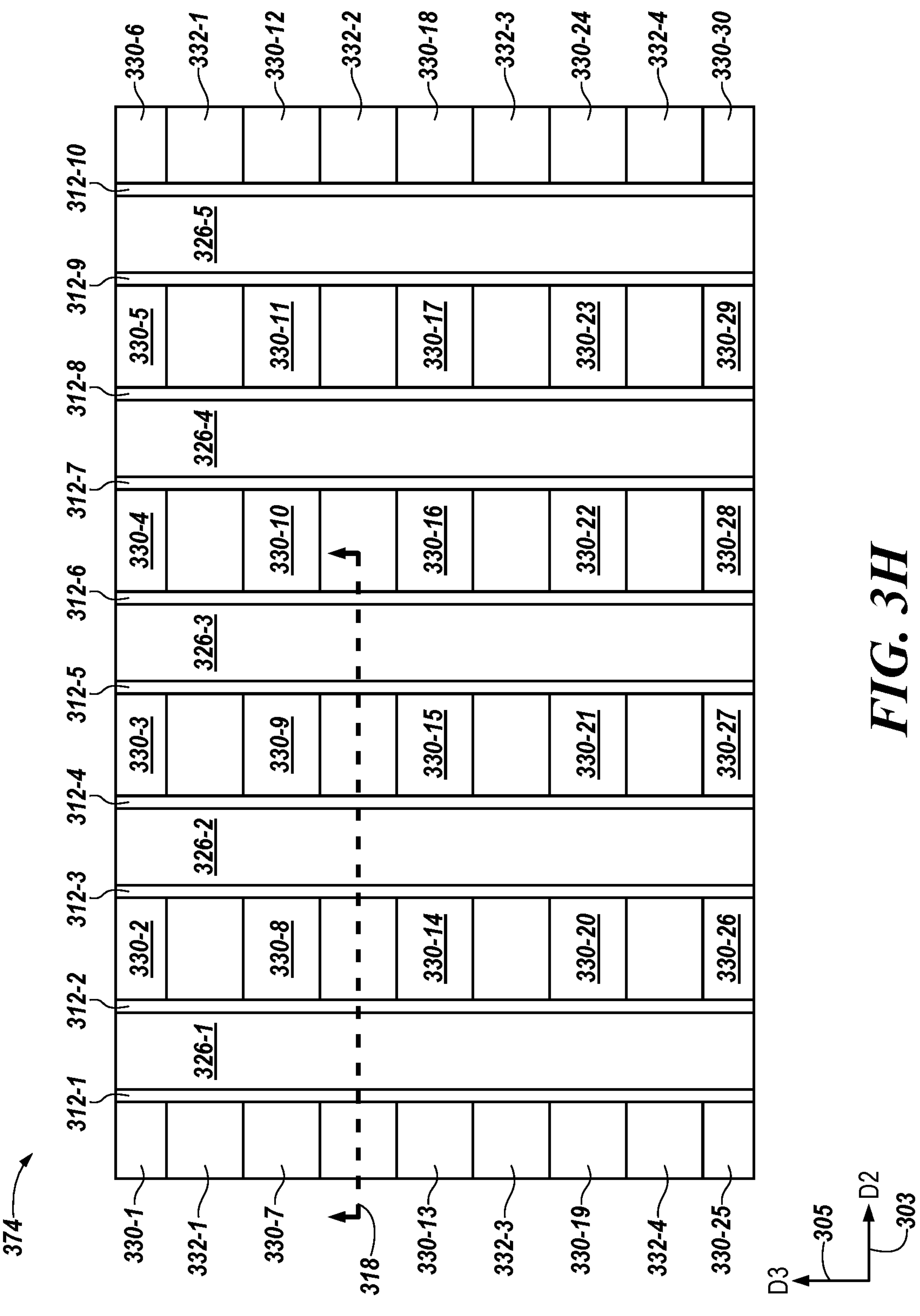

FIGS. 3G and 3H illustrate the side and top-down cross sections, respectively, of a semiconductor structure at one stage of a semiconductor fabrication process 374 in accordance with a number of embodiments of the present disclosure. FIGS. 3G and 3H illustrate the result of the stage in which a portion of the carbon material 330 may be removed from the semiconductor device at one stage of a semiconductor fabrication process 373 of FIGS. 3E and 3F to form a second set of vertical trenches 332. In some approaches, a self-aligned carbon (SAC) etch may remove a portion of the carbon in a line-space pattern. In some approaches, removing the portion of the carbon material 330 may include etching the portion of the carbon material 330 with a wet etchant or a dry etchant.

Figure 3I:
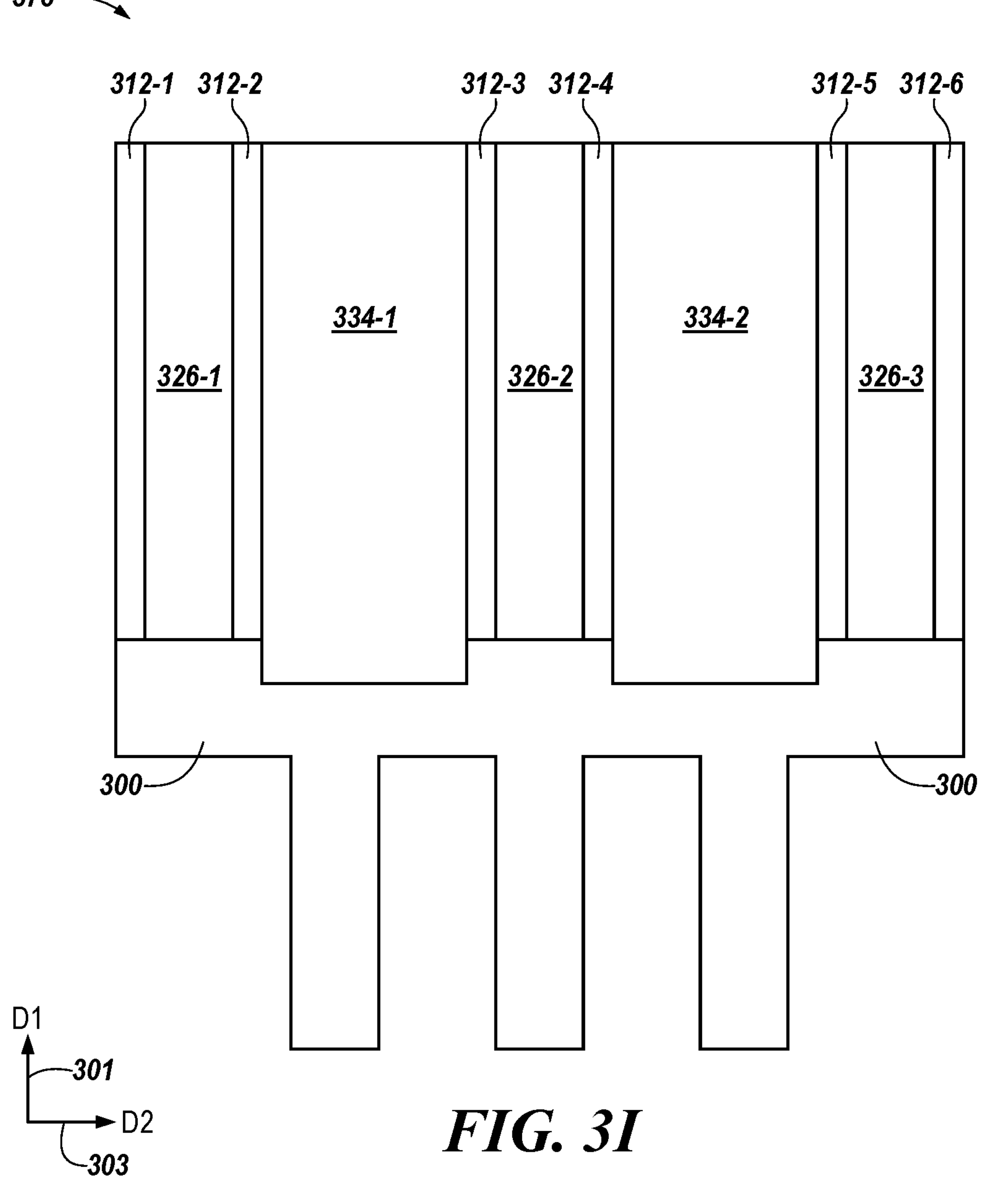
Figure 3J:
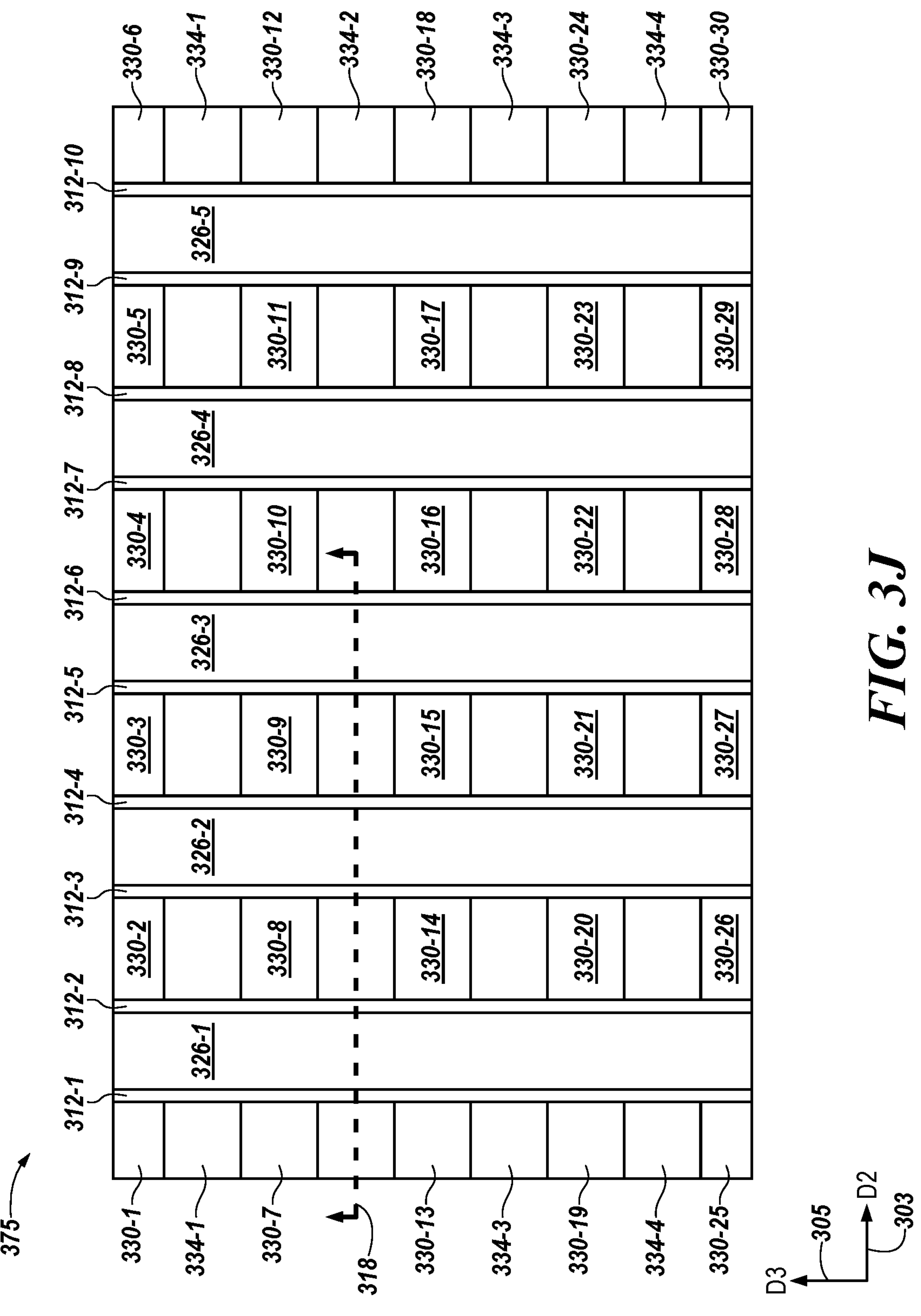

FIGS. 3I and 3J illustrate the side and top-down cross sections, respectively, of a semiconductor structure at one stage of a semiconductor fabrication process 375 in accordance with a number of embodiments of the present disclosure. FIGS. 3I and 3J illustrate the result of the stage in which an insulating fill material 334 can be deposited in the second set of vertical trenches 332 of the semiconductor device at one stage of a semiconductor fabrication process 374 of FIGS. 3G and 3H.

Figure 3K:
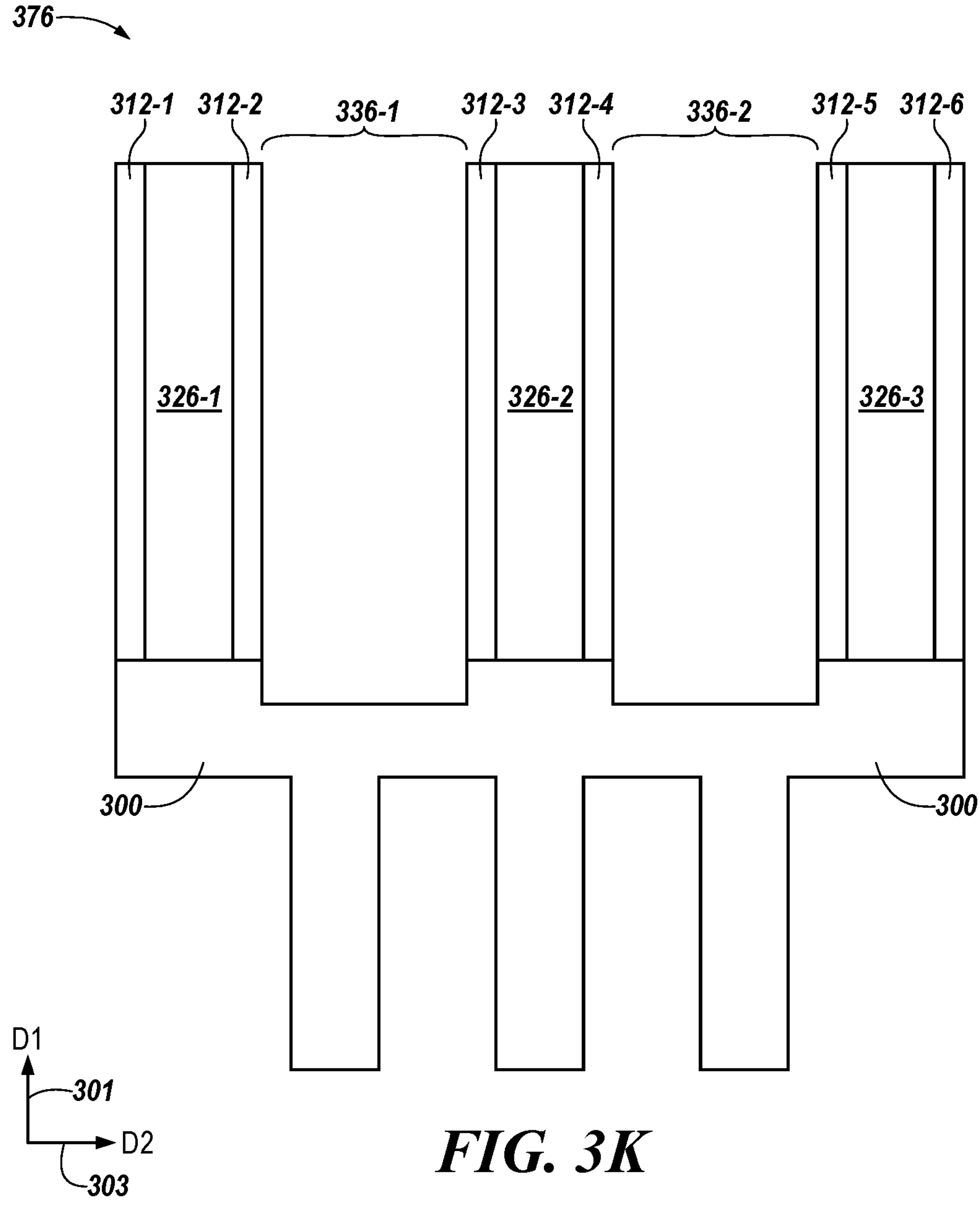
Figure 3L:
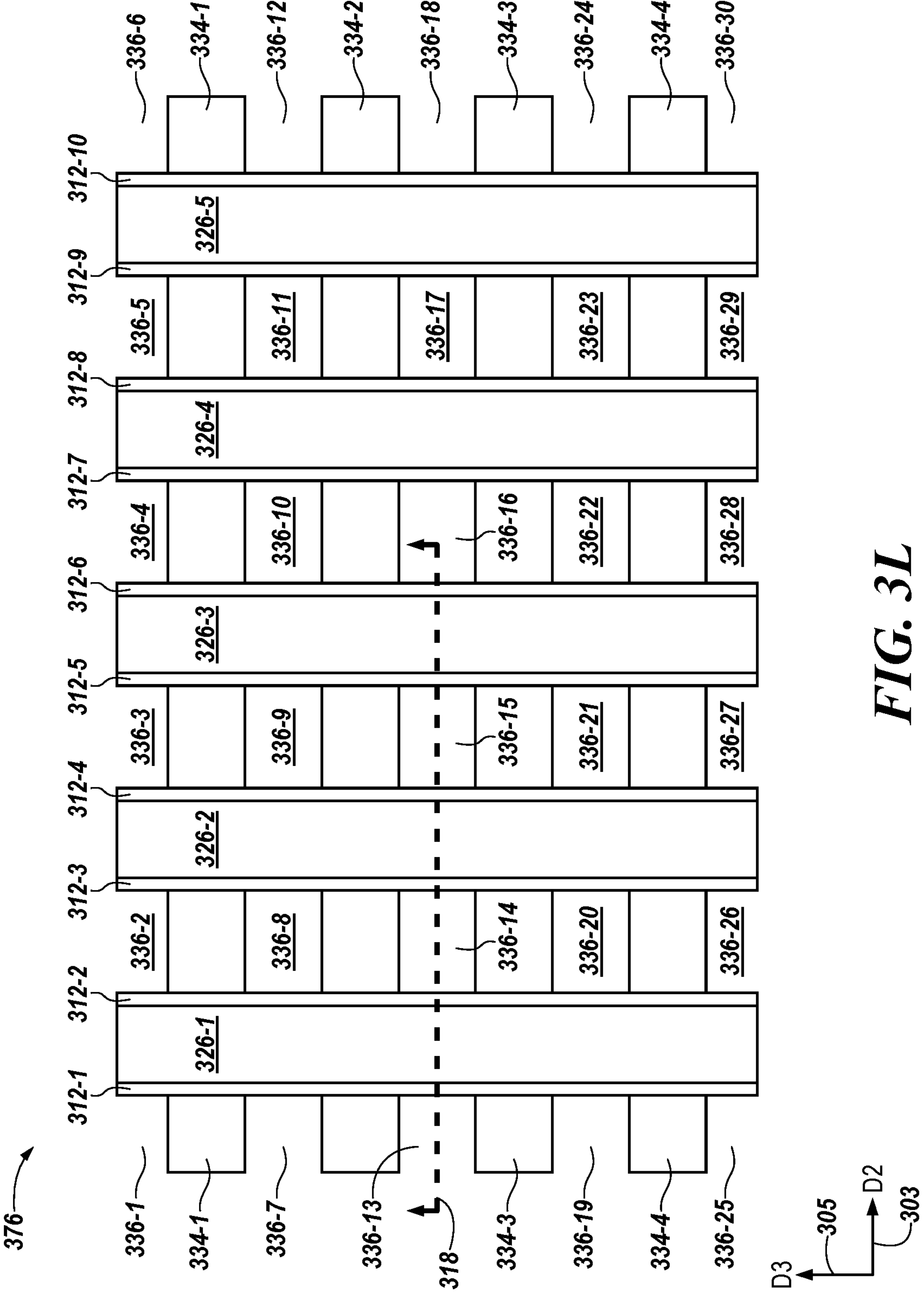

FIGS. 3K and 3L illustrate the side and top-down cross sections, respectively, of a semiconductor structure at one stage of a semiconductor fabrication process 376 in accordance with a number of embodiments of the present disclosure. FIGS. 3K and 3L illustrate the result of the stage in which the remaining carbon material 330 can be removed from the semiconductor structure at one stage of a semiconductor fabrication process 375 of FIGS. 3I and 3J to form a plurality of nitride material deposition spaces 336.

Figure 3M:
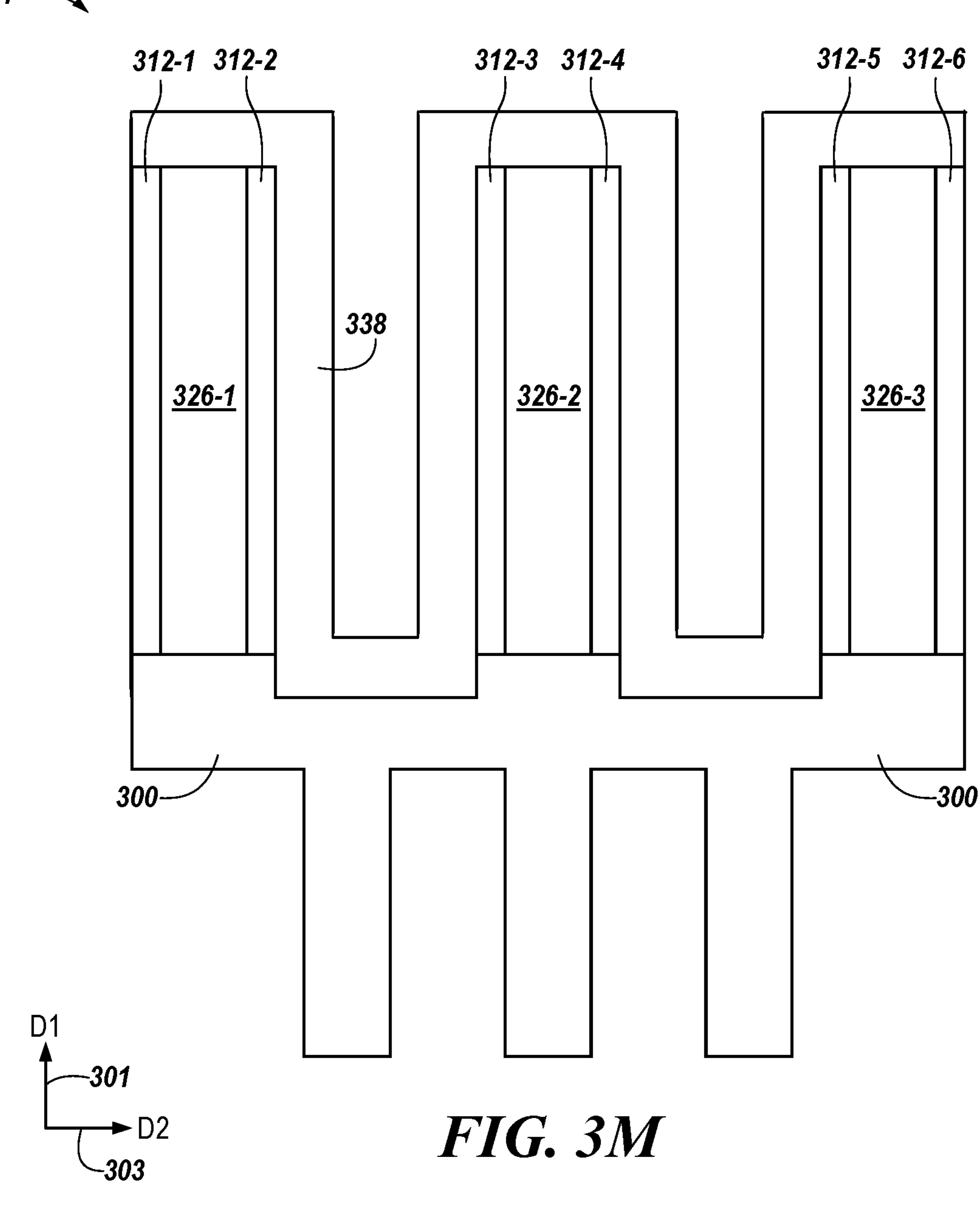
Figure 3N:
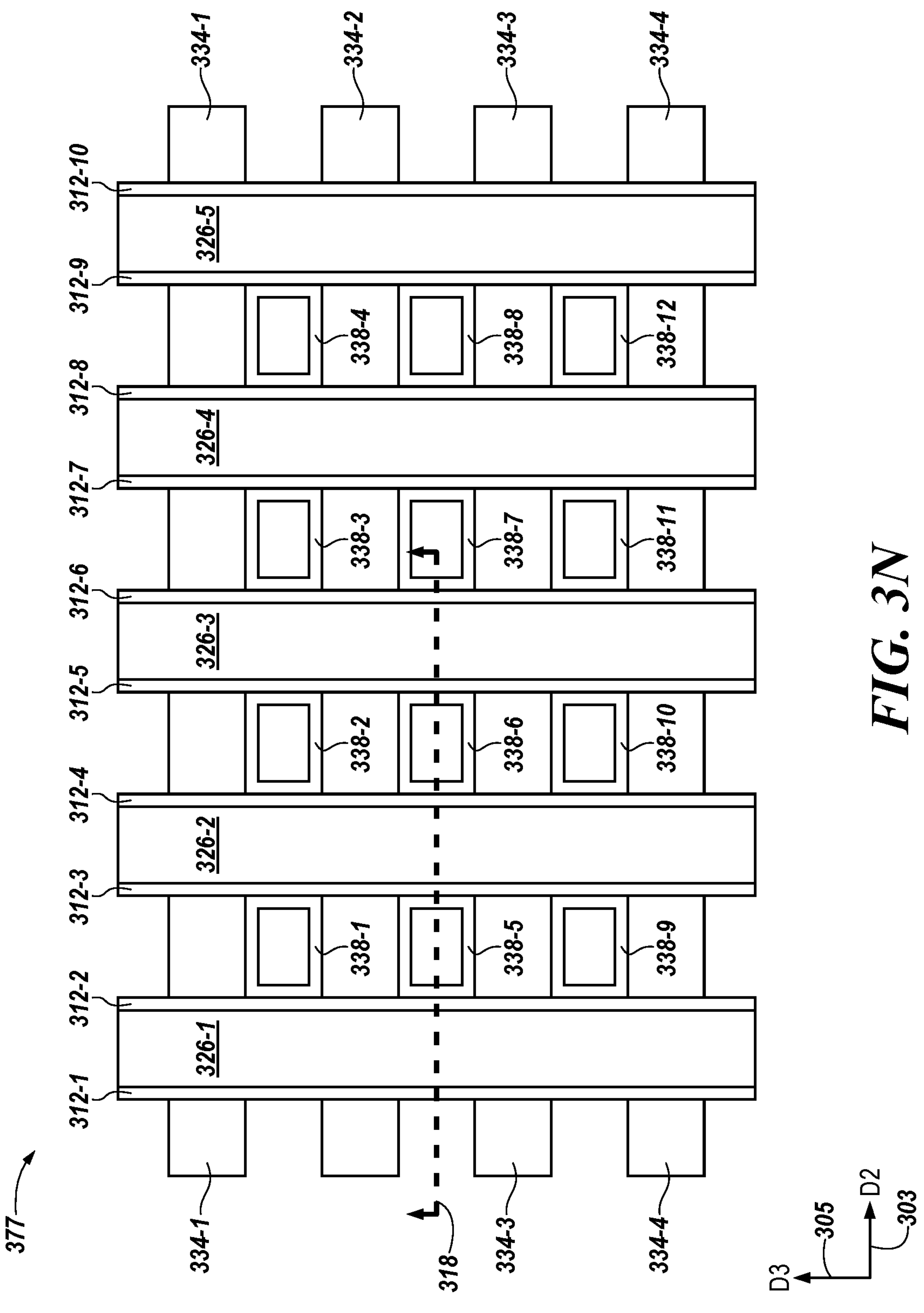

FIGS. 3M and 3N illustrate the side and top-down cross sections, respectively, of a semiconductor structure at one stage of a semiconductor fabrication process 377 in accordance with a number of embodiments of the present disclosure. FIGS. 3M and 3N illustrate the result of the stage in which a nitride material 338 may be deposited in each nitride material deposition space 336 of the plurality of nitride material deposition spaces 336 of the semiconductor structure at one stage of a semiconductor fabrication process 376 of FIGS. 3K and 3L. In some embodiments the nitride material 338 may be deposited conformally in each nitride material deposition space 336.

Figure 3O:
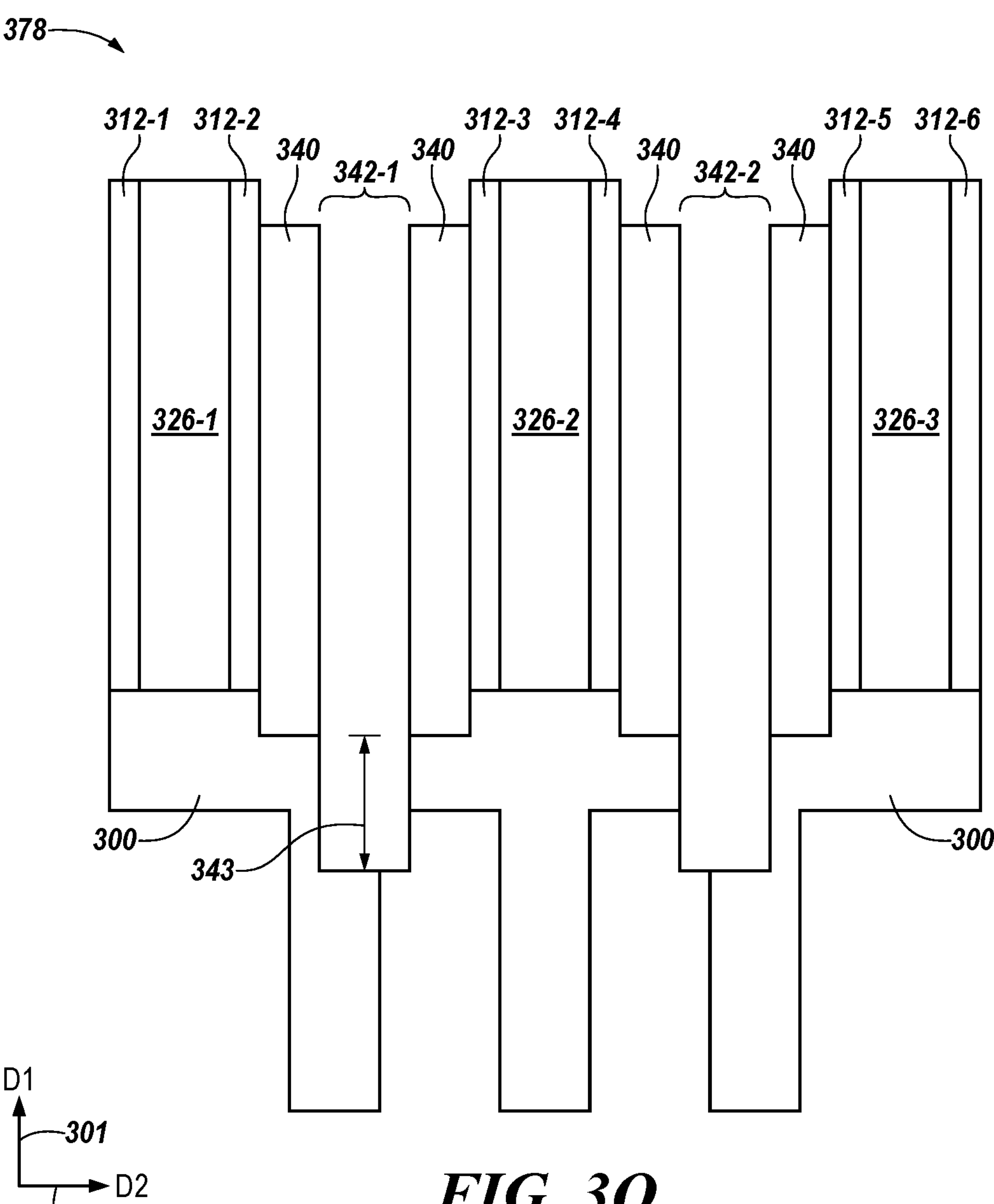
Figure 3P:
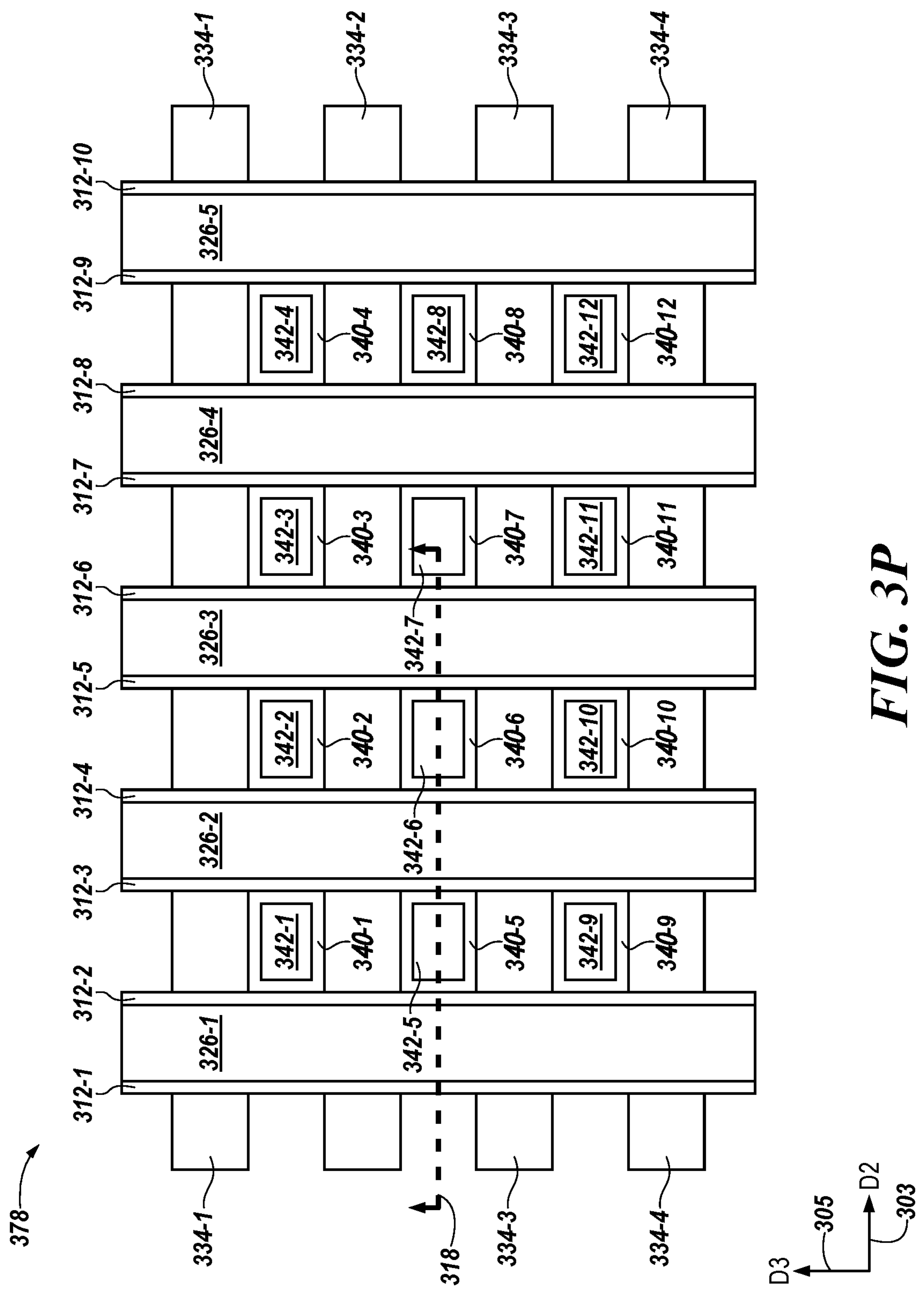

FIGS. 3O and 3P illustrate the side and top-down cross sections, respectively, of a semiconductor structure at one stage of a semiconductor fabrication process 378 in accordance with a number of embodiments of the present disclosure. FIGS. 3O and 3P illustrate the result of the stage in which at least a portion of the nitride material 338 and semiconductor substrate 300 may be removed from the semiconductor structure at one stage of a semiconductor fabrication process 377 of FIGS. 3M and 3N to create cell contact deposition spaces 342 extending through the remaining nitride material 340 and at least a portion of the height 343 of the semiconductor substrate 300. In some embodiments, removing at least a portion of the nitride material 338 and semiconductor substrate 300 may not remove any nitride material 338, such as when the nitride material 338 has been conformally deposited as a thin layer. In some embodiments, a portion of the nitride material 338 and a portion of the semiconductor substrate 300 may be removed using a punch process. A punch process may include using a dry etch process or a wet etch process to remove a portion of a material, such as removing a portion of an insulator (spacer) material to expose material underlying the insulator layer. Such processes can be referred to in the art as 'punch processes' because the spacer material is punched through to expose the underlying material.

Figure 3Q:
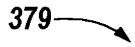
Figure 3Q:
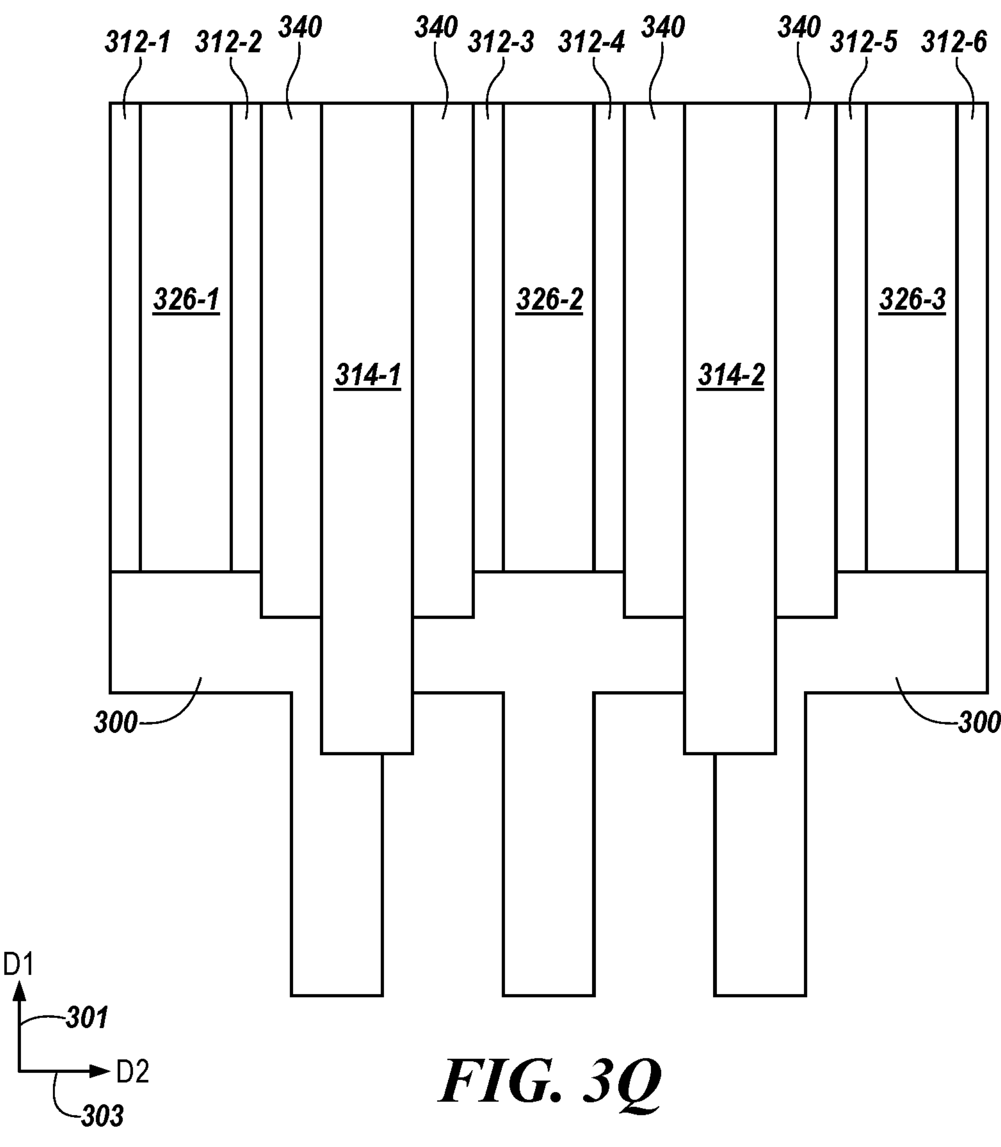
Figure 3R:
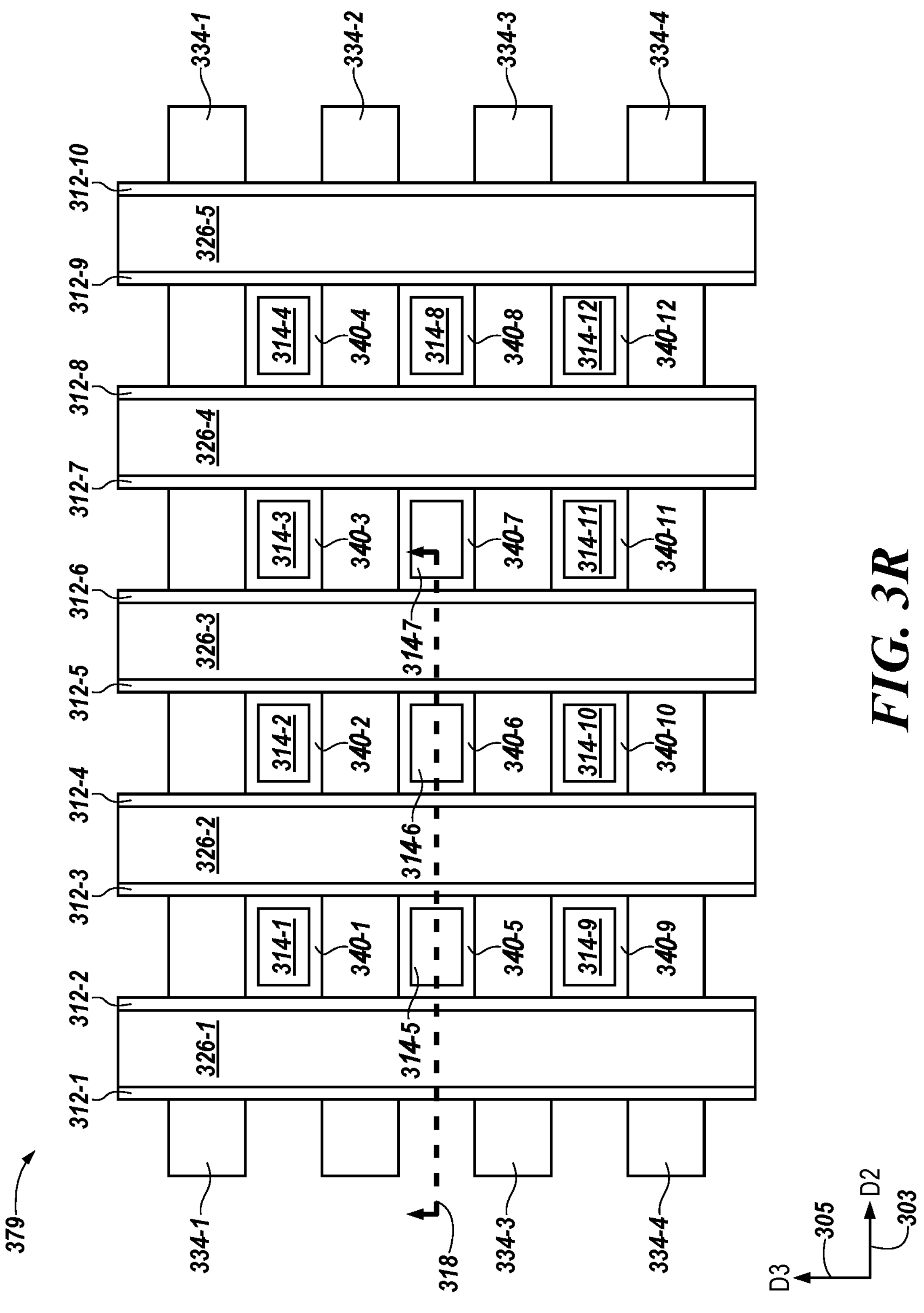

FIGS. 3Q and 3R illustrate the side and top-down cross sections, respectively, of a semiconductor structure at one stage of a semiconductor fabrication process 379 in accordance with a number of embodiments of the present disclosure. FIGS. 3Q and 3R illustrate the result of the stage in which a plurality of cell contacts 314 may be formed in the cell contact deposition spaces 342 of the semiconductor structure at one stage of a semiconductor fabrication process 378 of FIGS. 3O and 3P. In some embodiments, the plurality of cell contacts 314 may include multiple portions that include different materials (e.g., a polysilicon portion and a metal portion).

Figure 3S:
Figure 3S:
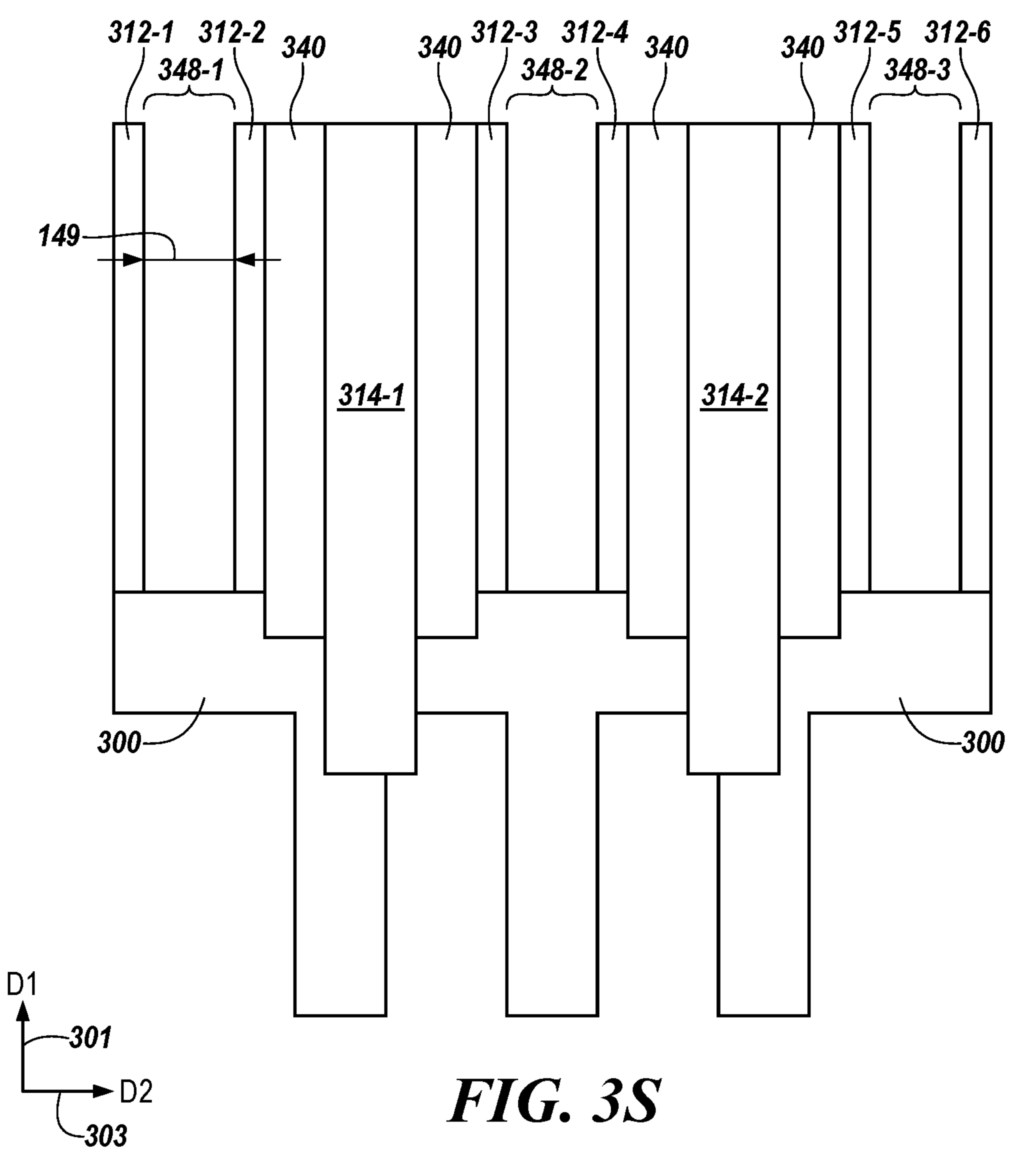
Figure 3T:
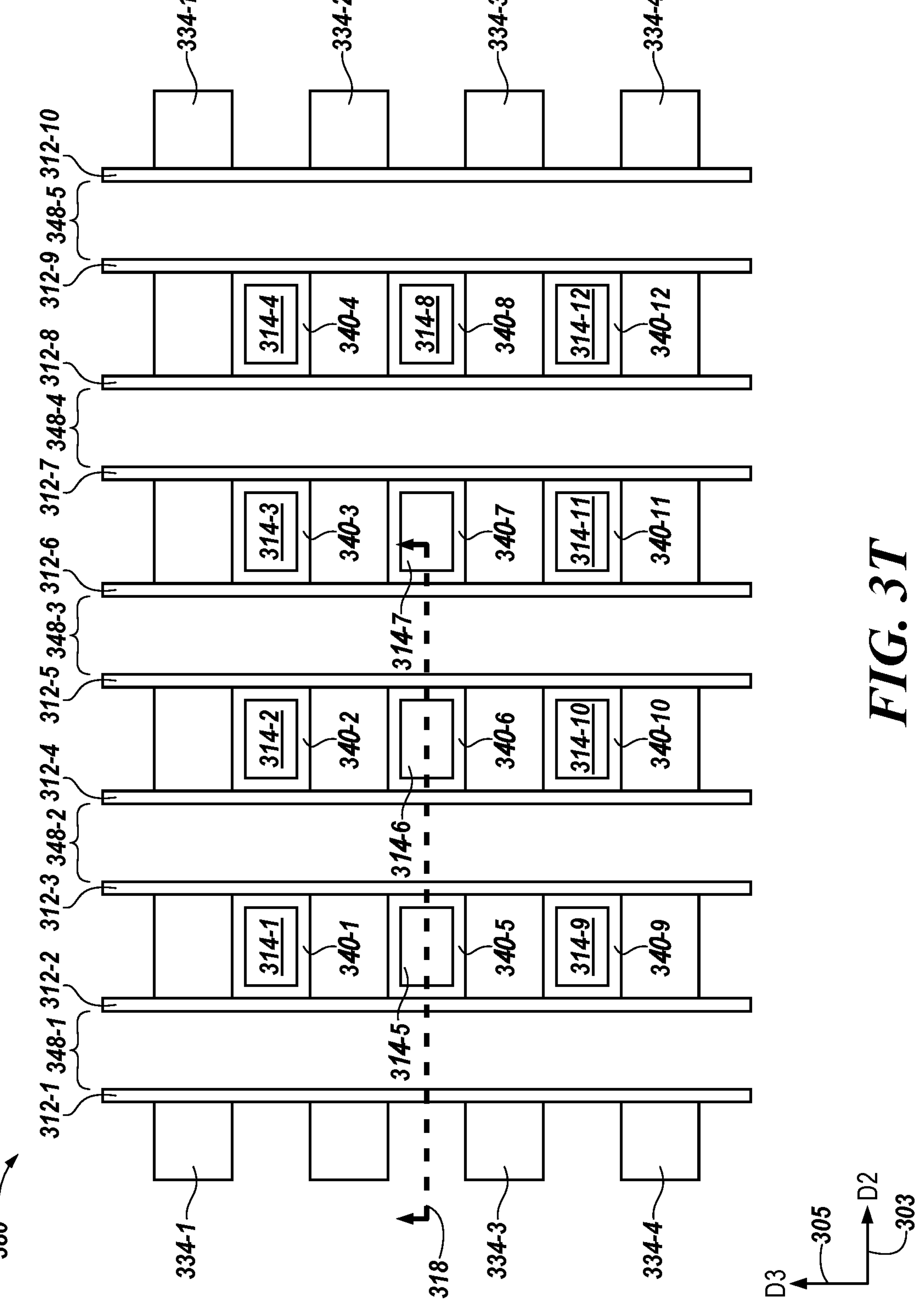

FIGS. 3S and 3T illustrate the side and top-down cross sections, respectively, of a semiconductor structure at one stage of a semiconductor fabrication process 380 in accordance with a number of embodiments of the present disclosure. FIGS. 3S and 3T illustrate the result of the stage in which the dummy digit lines 326 may be removed from the semiconductor structure at one stage of a semiconductor fabrication process 379 of FIGS. 3Q and 3R to form a plurality of vertical openings 348 having a first width 149. In some embodiments, the dummy digit lines may be removed subsequent to forming the cell contacts.

Figure 3U:
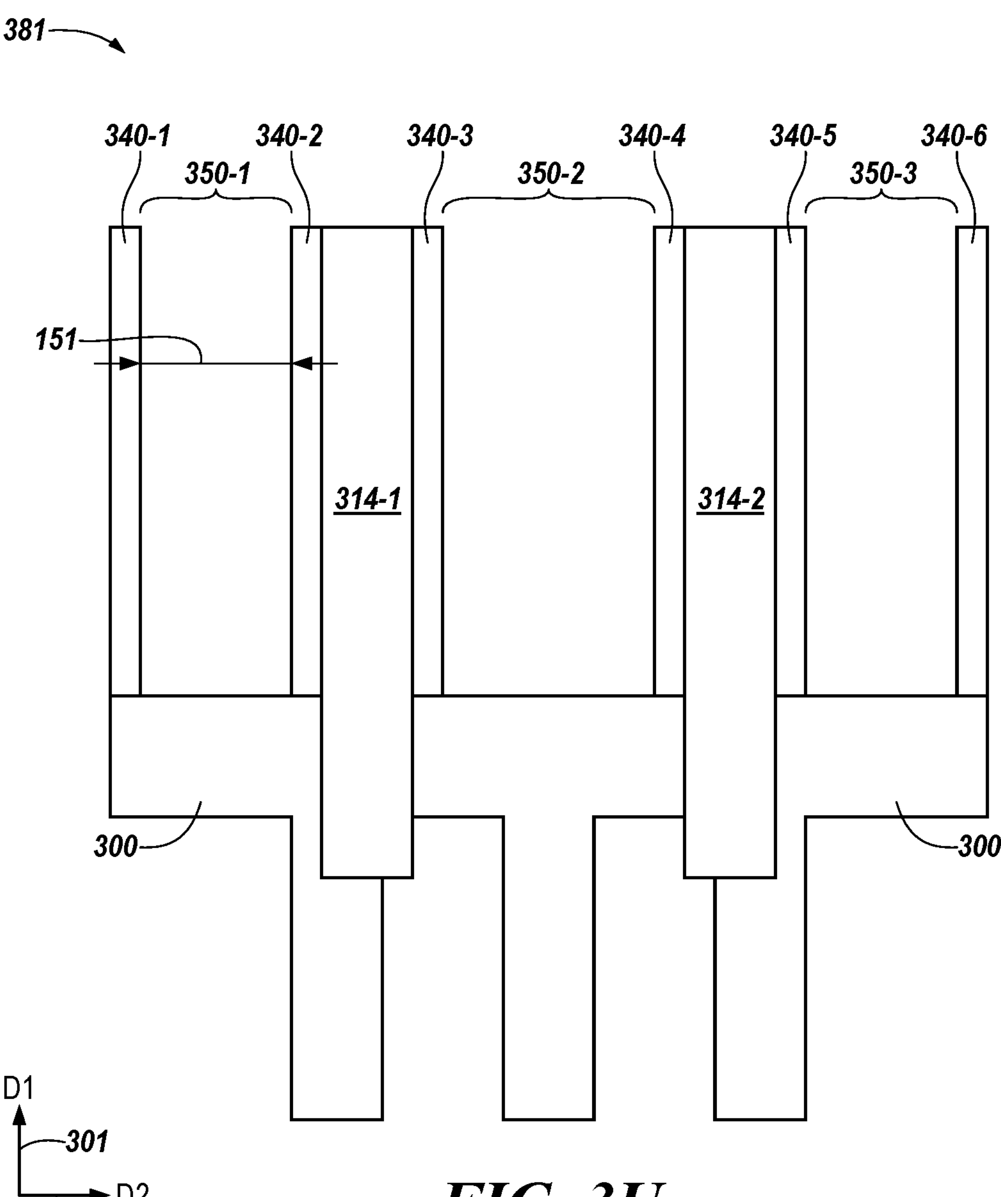
Figure 3V:
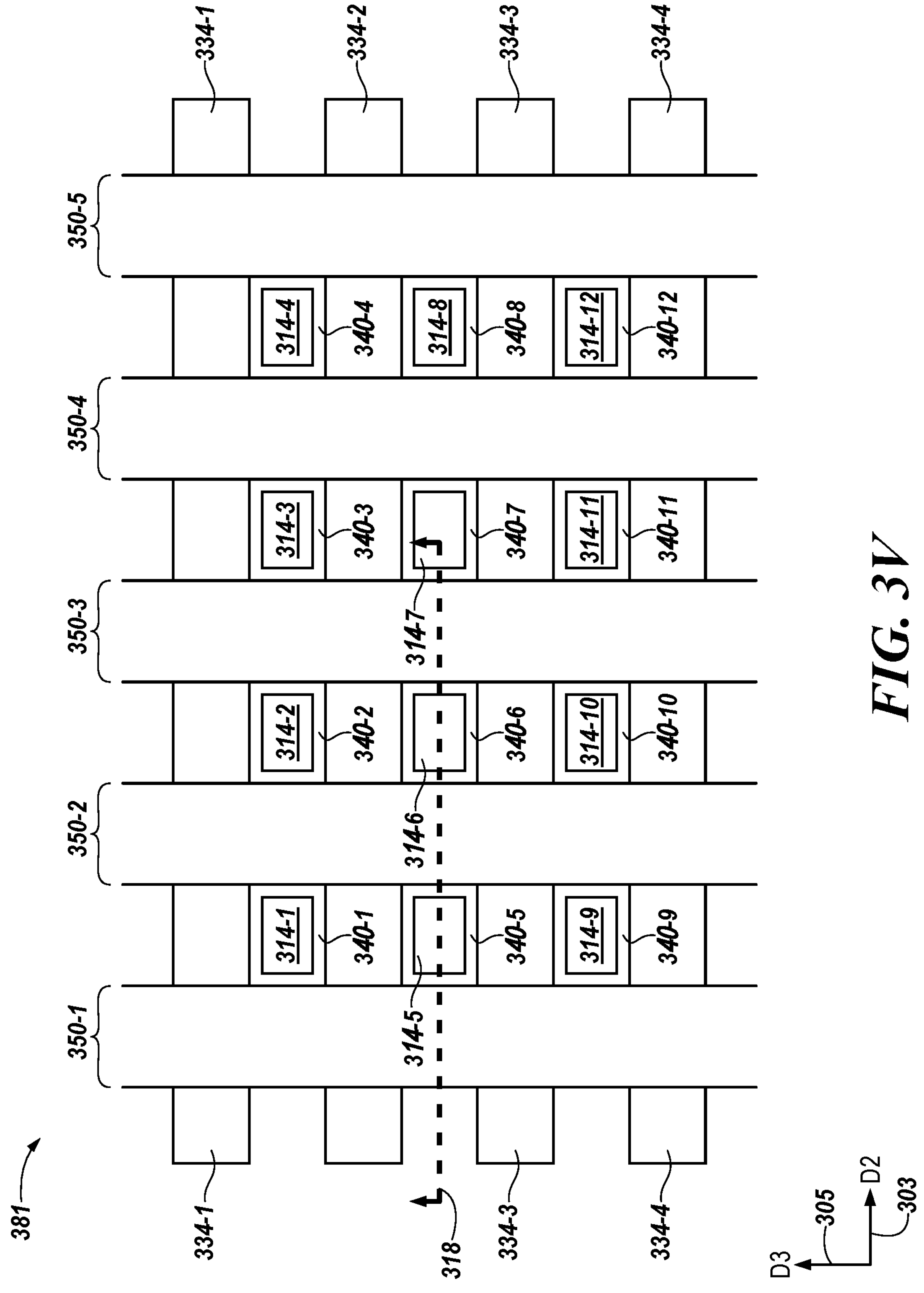
Figure 3W:
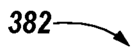
Figure 3W:
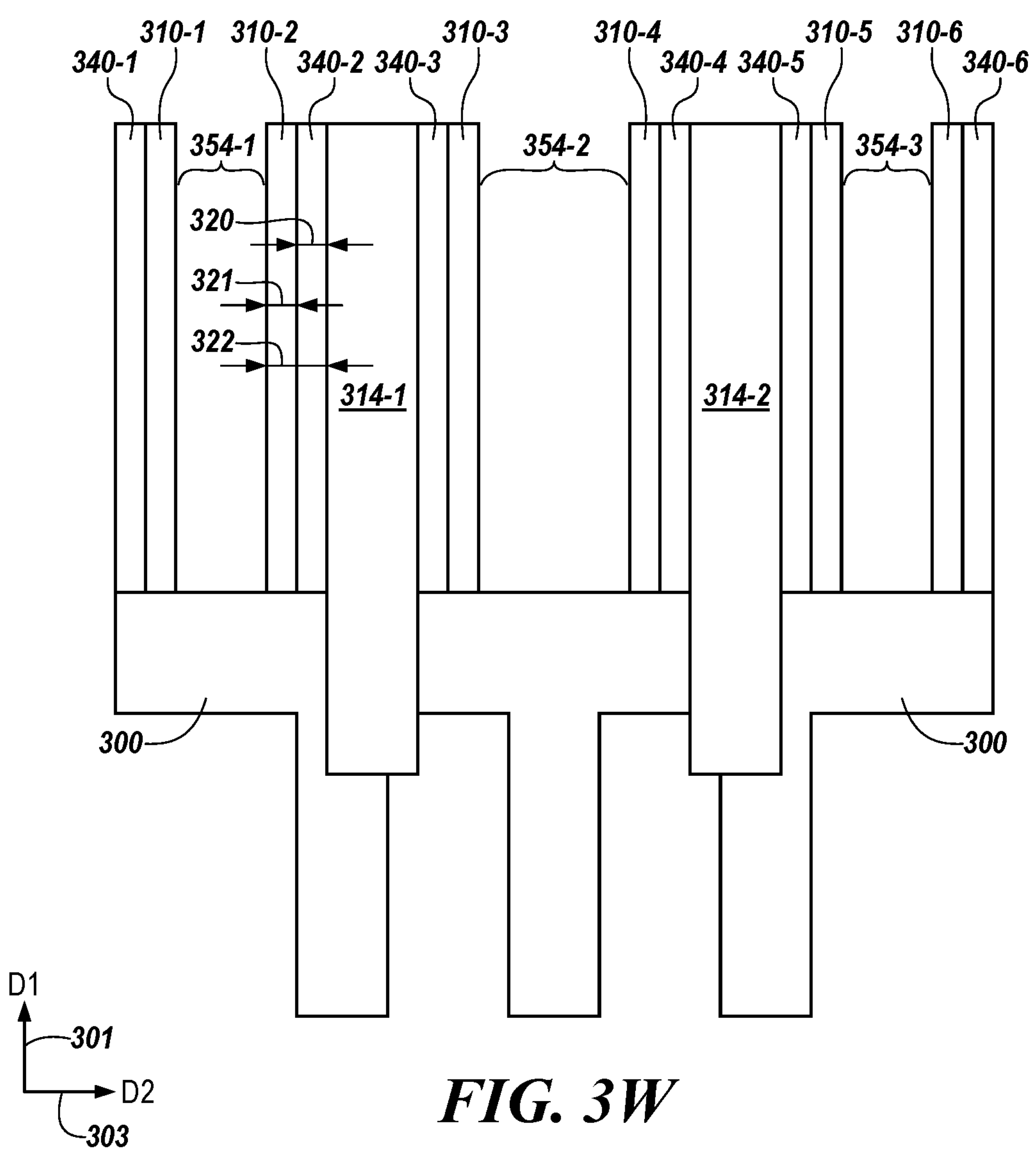

FIGS. 3U and 3V illustrate the side and top-down cross sections, respectively, of a semiconductor structure at one stage of a semiconductor fabrication process 381 in accordance with a number of embodiments of the present disclosure. FIGS. 3U and 3V illustrate the result of the stage in which at least portion of the remaining nitride material 340 and/or the sacrificial insulating material 312 may be removed from the semiconductor structure at one stage of a semiconductor fabrication process 380 of FIGS. 3S and 3T to expand each vertical opening 348 of the plurality of vertical openings 348 to form expanded vertical openings 350 with a second width 351 that is greater than the first width 350. In some examples, removing at least a portion of the sacrificial insulating material 312 to expand the vertical openings 348 further comprises removing some but not all of the remaining nitride material 340. For example, a vertical opening 348 may be expanded by removing some, but not all, of the remaining nitride material 340 and/or the sacrificial insulating material 312 by etching a sidewall of the vertical opening 348 using a wet etchant or a dry etchant. In some examples, the thickness 320 extending in a horizontal direction of remaining portion of the remaining nitride material 340 and/or sacrificial insulating material 312, alone or in combination, can measure less than 3 nm. in some embodiments, the remaining thickness 320 (as shown in FIG. 3W) can be less than 2 nm or less than 1 nm. In some embodiments, the remaining thickness 320 can be in a range from about 0.1 nm to less than 3.0 nm. In some embodiments, the remaining thickness 320 can be in a range from about 0.1 nm to about 2.0 nm. In some embodiments, the remaining thickness 320 of the remaining nitride material 340 can be less than 1 nm, such as a range from about 0.1 nm to about 1.0 nm. However, in some embodiments, removing the at least portion of the nitride material 338 and/or the sacrificial insulating material 312 comprises removing all of the remaining nitride material 340 and/or the sacrificial insulating material 312 such that the thickness 320 can be equal to zero.

Figure 3X:
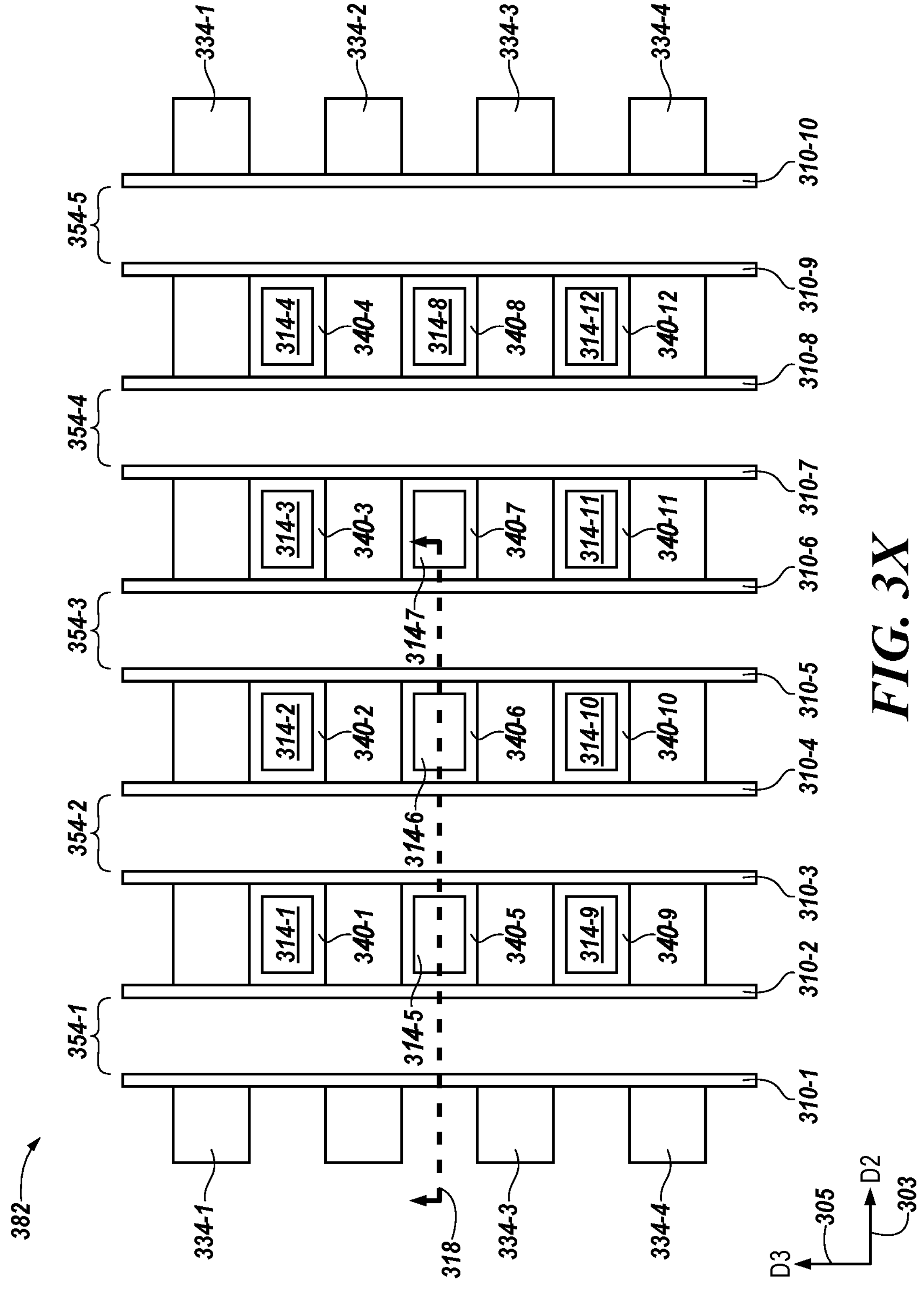

FIGS. 3W and 3X illustrate the side and top-down cross sections, respectively, of a semiconductor structure at one stage of a semiconductor fabrication process 382 in accordance with a number of embodiments of the present disclosure. FIGS. 3W and 3X illustrate the result of the stage in which a digit line insulating material 310 can be deposited in the expanded vertical openings 350 of the semiconductor structure at one stage of a semiconductor fabrication process 381 of FIGS. 3U and 3V to form digit line deposition spaces 354. The digit line insulating material 310 can be conformally deposited in the expanded vertical openings 350 and the bottom portion of the insulating material 310 can be removed, such as by a wet or dry etch, to form the conformal deposition of insulating material 310 on the remaining nitride material 340. In some embodiments, the thickness 121 of the digit line insulating material 310 can be less than 3 nm. In some embodiments, where the thickness 320 of the nitride material 338 and the sacrificial insulating material 312 equal zero, the digit line insulating material may be conformally deposited on the vertical sidewall of the cell contacts 314. In some embodiments, the combined thickness 322 of the digit line insulating material 310 and the remaining nitride material 340 may be less than 3 nm. In some examples, the combined thickness 322 of the digit line insulating material 310 and remaining nitride material 340 may be in a range from 5 nm and 7 nm.

Figure 3Y:
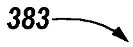
Figure 3Y:
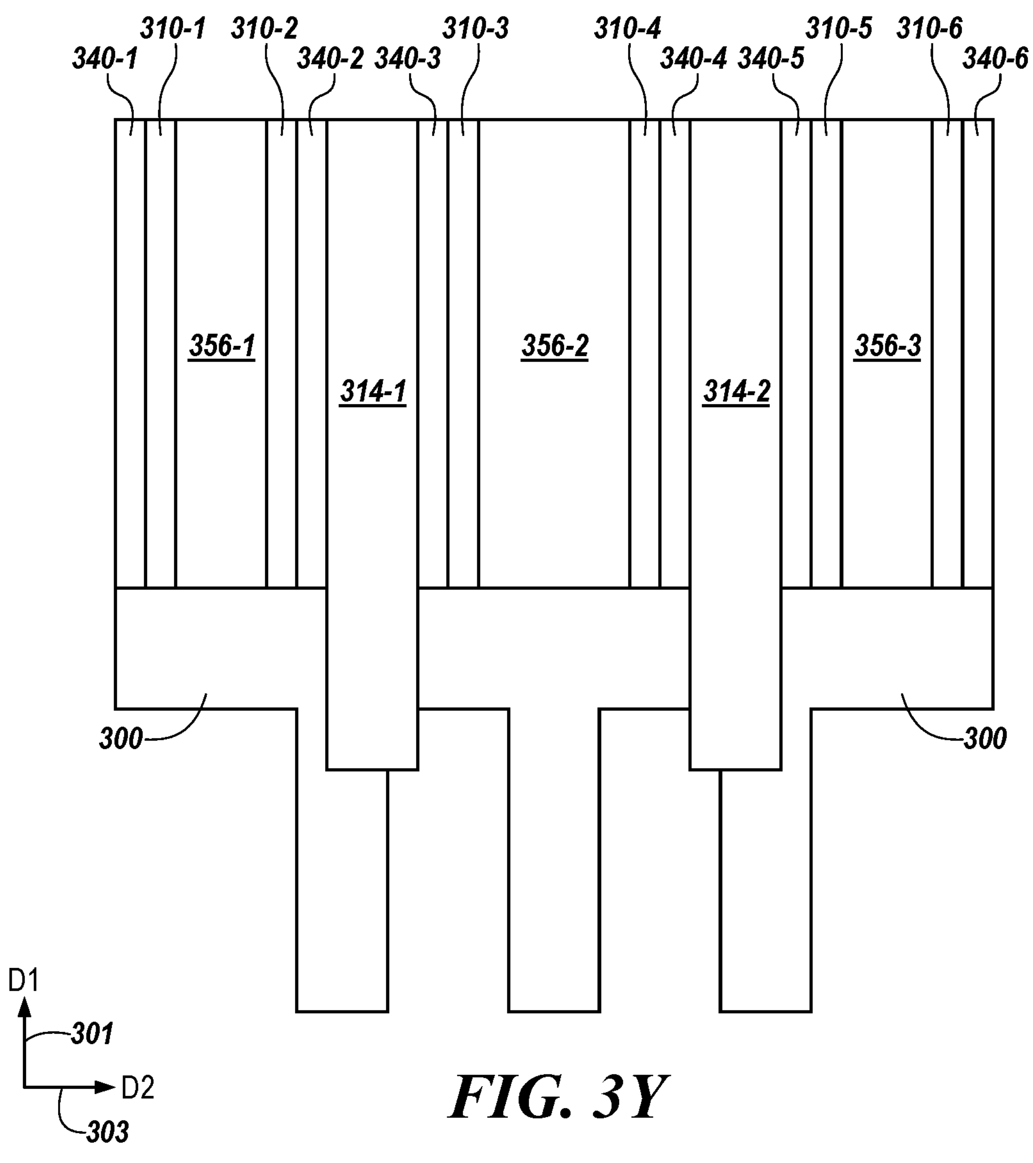
Figure 3Z:
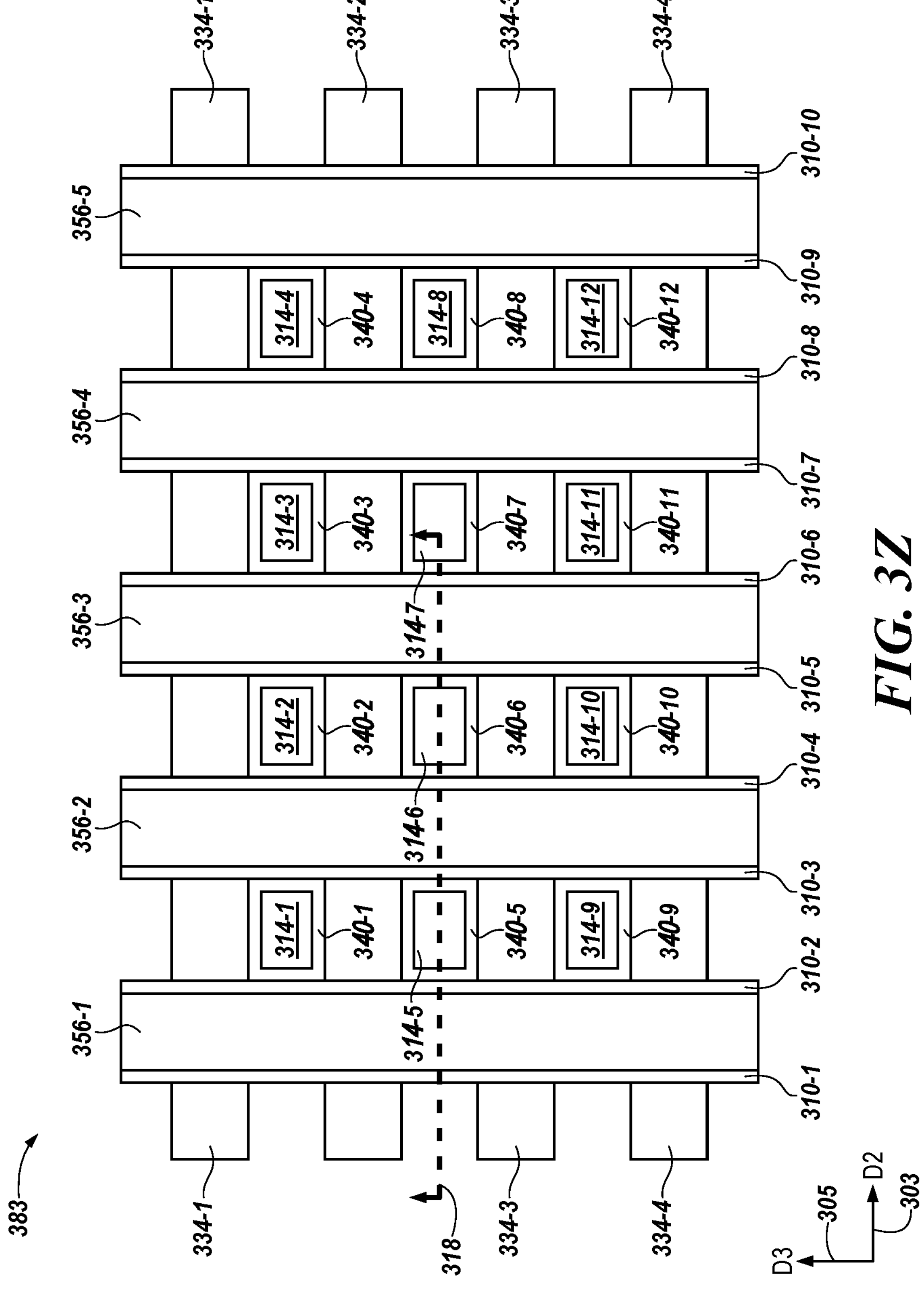
Figure 3A:
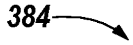
Figure 3A:
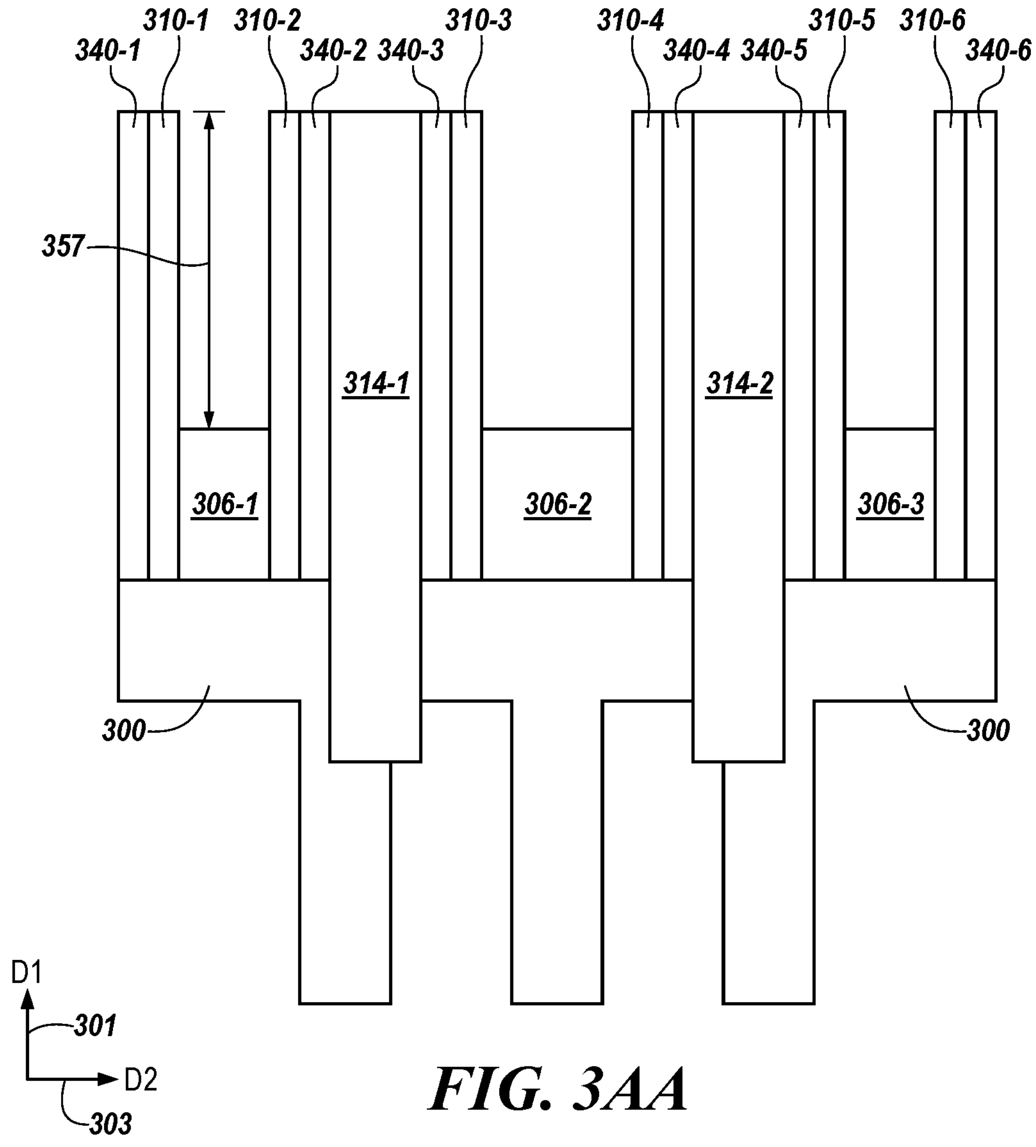
Figure 3A:
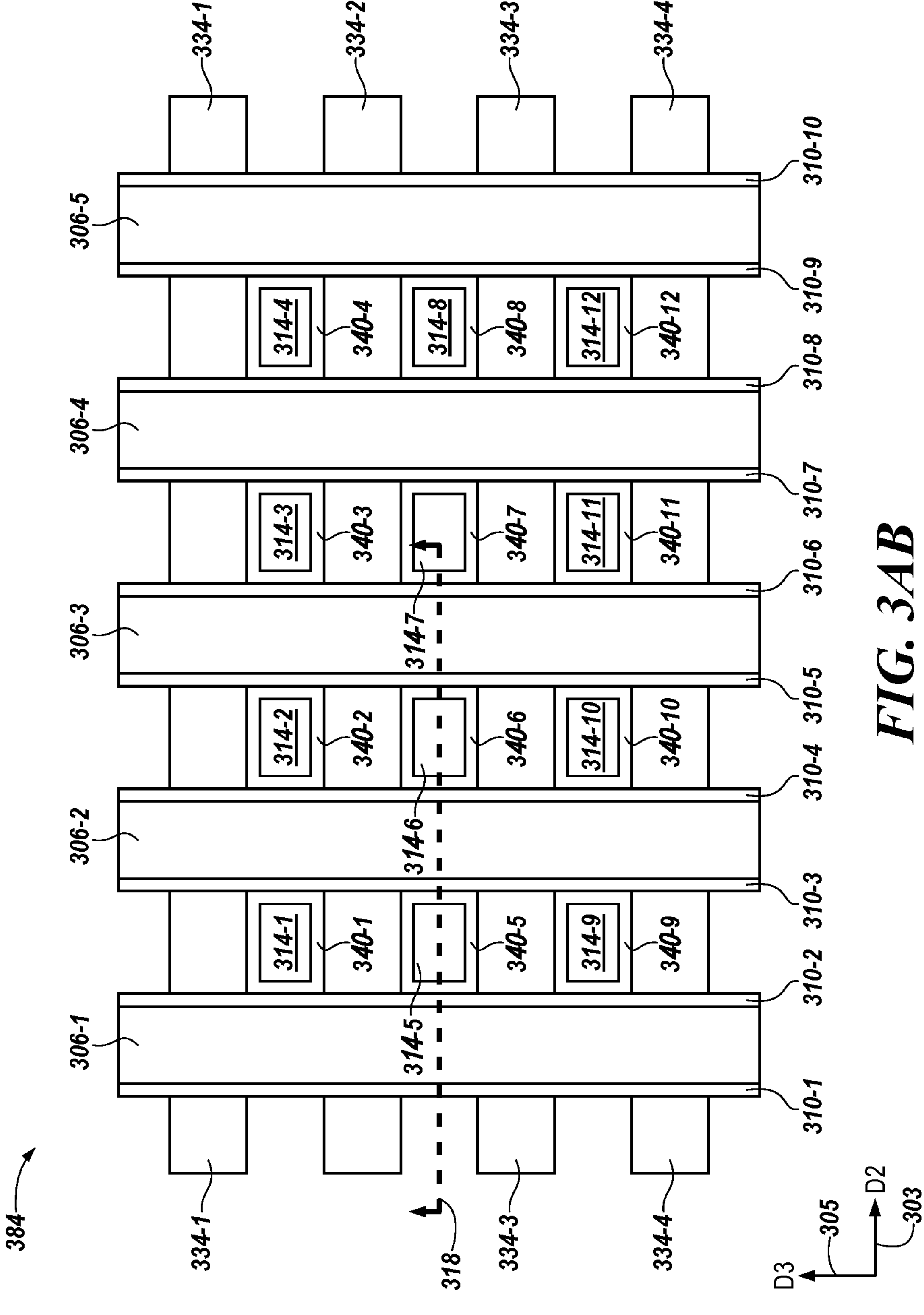
Figure 3A:
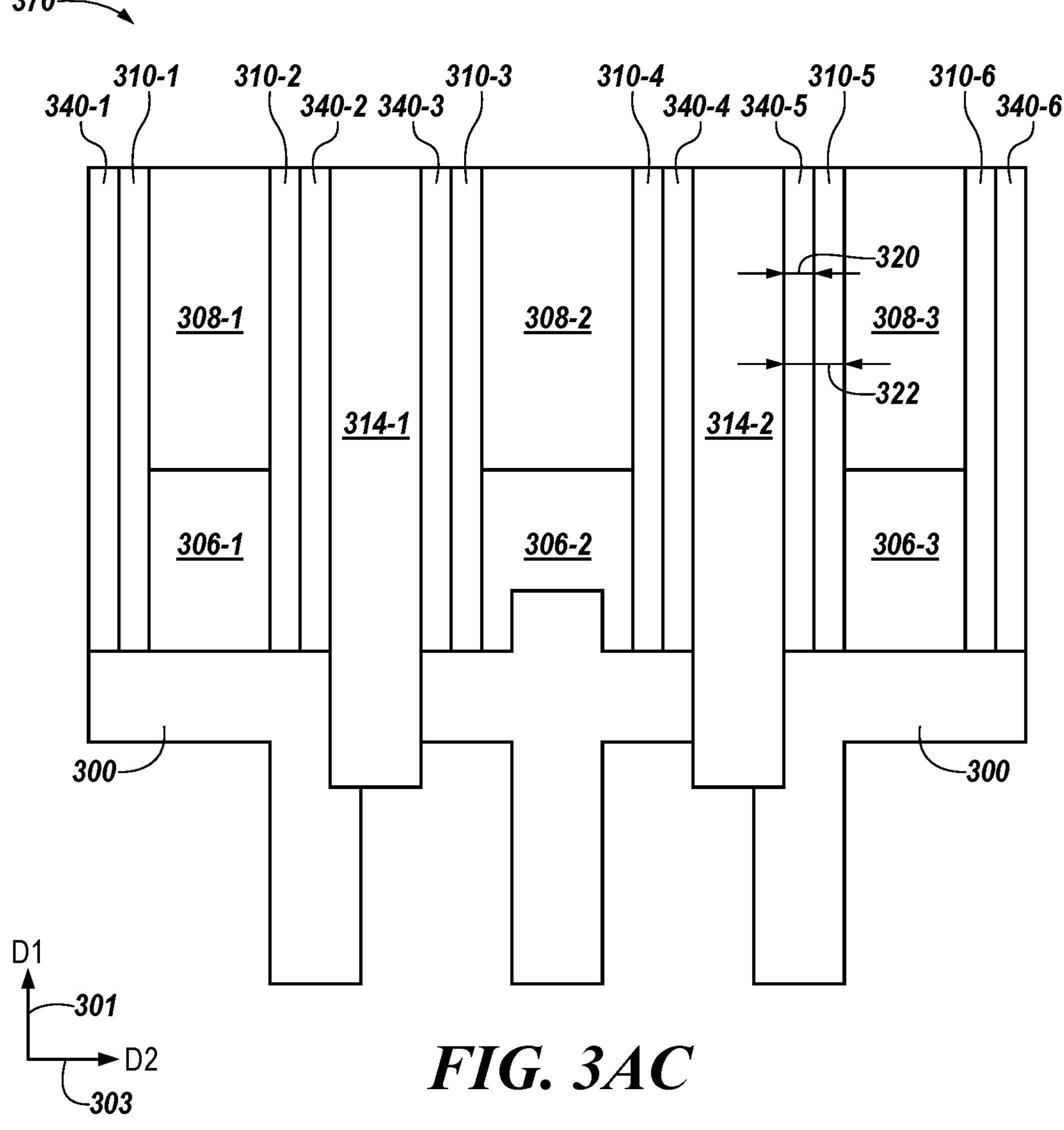
Figure 3A:
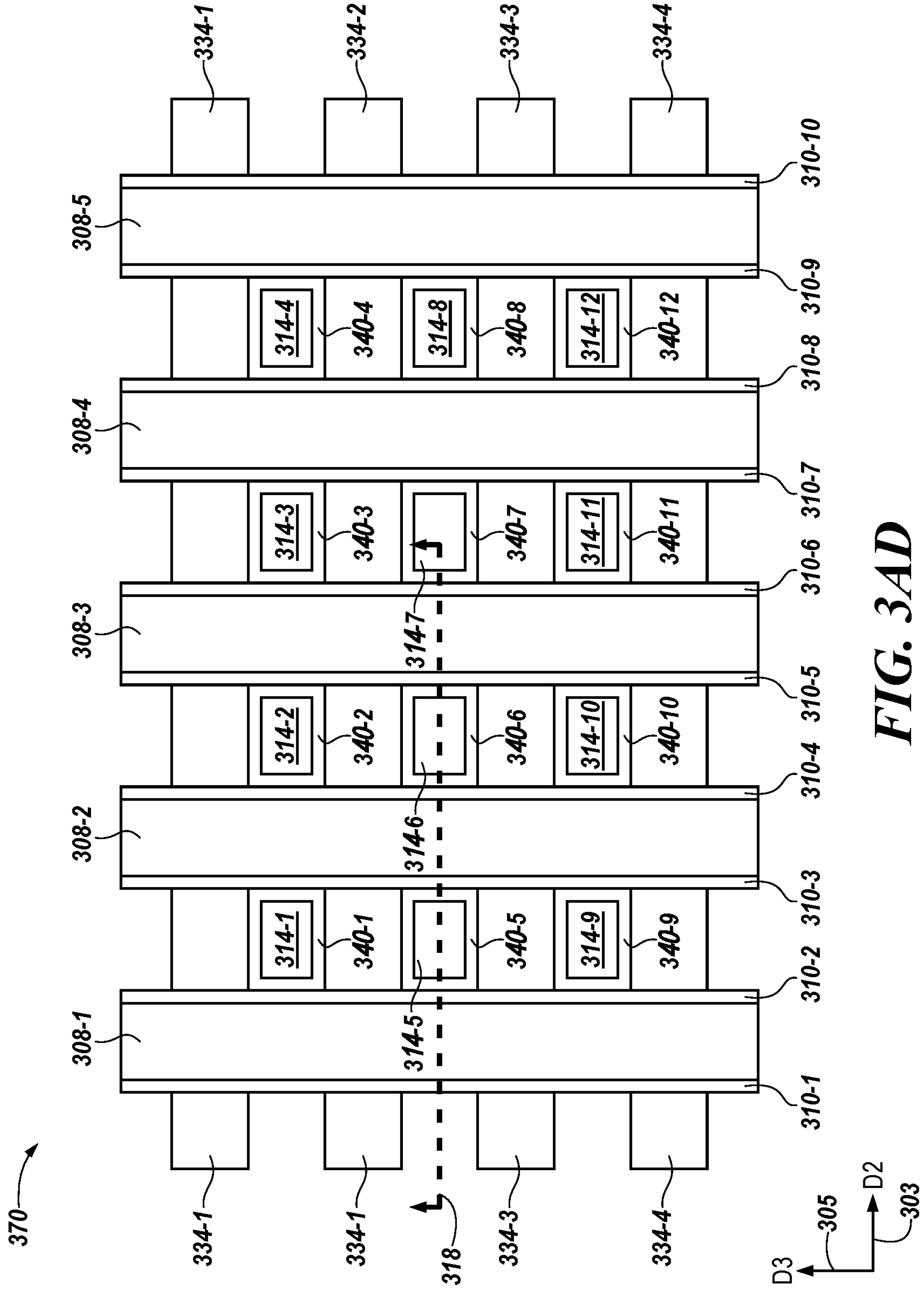

FIGS. 3Y and 3Z illustrate the side and top-down cross sections, respectively, of a semiconductor structure at one stage of a semiconductor fabrication process 383 in accordance with a number of embodiments of the present disclosure. FIGS. 3Y and 3Z illustrate the result of the stage in which digit line material 356 can be deposited in the digit line deposition spaces 354 of the semiconductor structure at one stage of a semiconductor fabrication process 382 of FIGS. 3W and 3X. The digit line material 356 may include a metal digit line material such as tungsten, ruthenium, molybdenum, titanium, tantalum, cobalt, titanium nitride, tantalum nitride, tungsten silicide, cobalt silicide, tantalum silicide, doped silicon, doped germanium, or any combination thereof. In some embodiments, the digit line material is formed entirely of (e.g., is only formed of) a metal digit line material.

In some embodiments, the digit line material 356 may be deposited after the semiconductor structure at one stage of a semiconductor fabrication process 382 has undergone any heat treatments. For example, after the semiconductor structure at one stage of a semiconductor fabrication process 382 has been annealed, such as by rapid thermal processing. A digit line material 356 deposited after any annealing process may not be exposed to changes in temperature which may negatively impact the properties of the digit line material 356 which may help allow the use of new digit line materials. For example, the digit line deposition spaces 354 may be filled with a ruthenium digit line material 356 to help produce digit lines 306 with low electrical resistivity.

FIGS. 3AA and 3AB illustrate the side and top-down cross sections, respectively, of a semiconductor structure at one stage of a semiconductor fabrication process 384 in accordance with a number of embodiments of the present disclosure. FIGS. 3AA and 3AB illustrate the result of the stage in which a portion of the digit line material 356 may be removed from the semiconductor structure at one stage of a semiconductor fabrication process 383 of FIGS. 3Y and 3Z to form a plurality of digit lines 306. For example, a portion of the digit line material 356 may be removed by etching the portion of the digit line material 356 by performing a dry etch or a wet etch to selectively remove the portion of the digit line material 356. In some embodiments, the portion of the digit line material 356 in the digit line deposition space 354 may be removed to form digit lines 306 that are recessed a distance 357 in the digit line deposition space 354.

FIGS. 3AC and 3AD illustrate the side and top-down cross sections, respectively, of an apparatus 370 in accordance with a number of embodiments of the present disclosure. FIGS. 3AC and 3AD illustrate the result of the stage in which a cap material 308 may be deposited on each digit line 306 of the plurality of digit lines 306 of the semiconductor structure at one stage of a semiconductor fabrication process 384 of FIGS. 3AA and 3AB. In some embodiments, the cap material 308 can include a dielectric material with a high dielectric constant such as a high-k nitride material. In some embodiments, any combination, or all of, the sacrificial insulating material 312, the insulating fill material 334, the nitride material 338, the remaining nitride material 340, the cap material 308, and the insulating material base layer 307 may be the same material.

Figure 4:
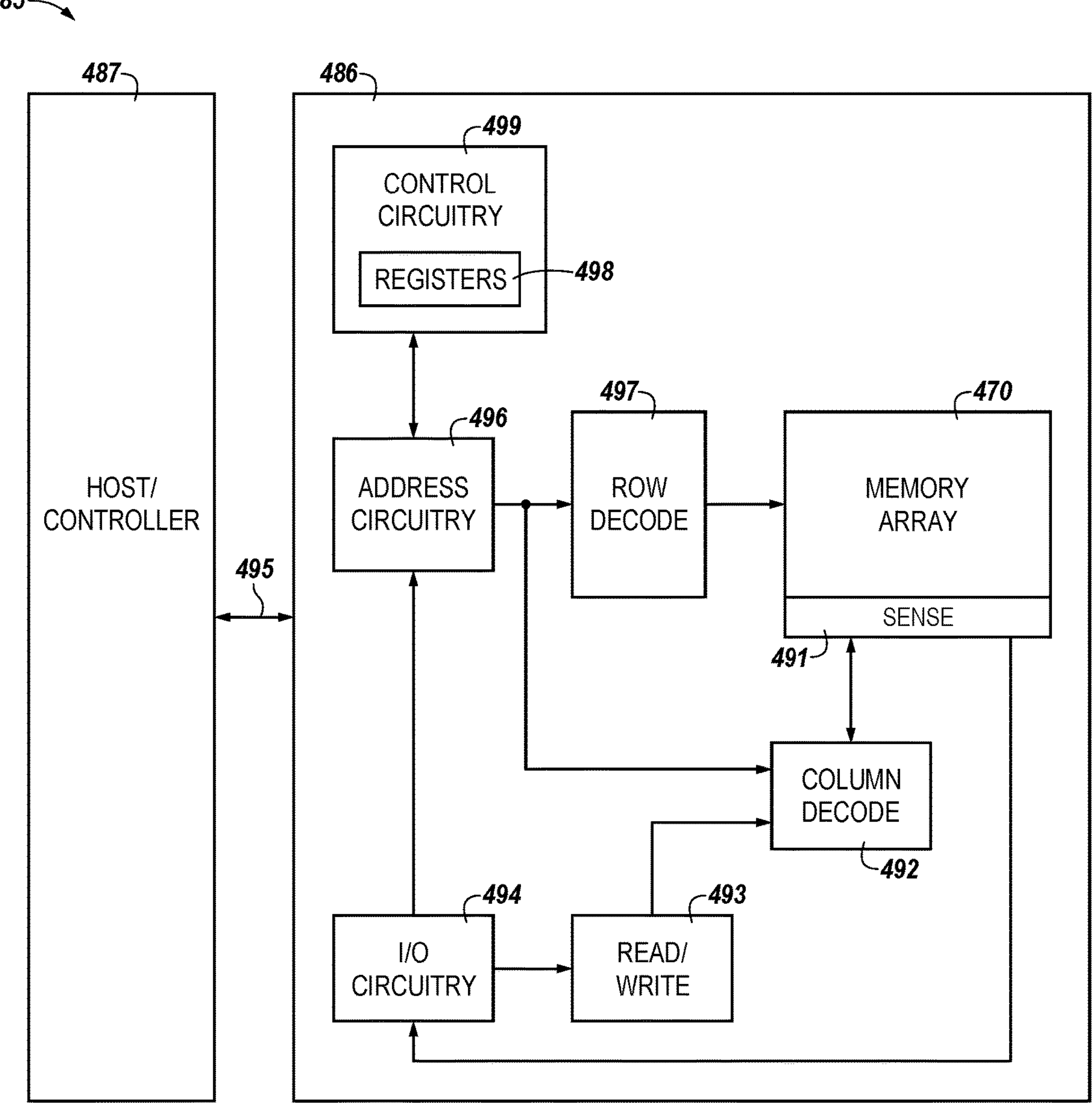
FIG. 4 is a block diagram of an apparatus in the form of a computing system including a memory device in accordance with a number of embodiments of the present disclosure.

FIG. 4 is a block diagram of an apparatus in the form of computing system including an apparatus 470 (e.g., memory array) in accordance with a number of embodiments of the present disclosure. As used herein, a memory device 486, an apparatus 470, and/or a host 485, for example, might also be separately considered a "device." According to embodiments, the memory device 486 may comprise at least one apparatus 470 with a memory cell formed having a digit line and body contact, according to the embodiments described herein.

In this example, the system includes a controller 487 coupled to memory device 486 via an interface 495. The computing system can be a personal laptop computer, a desktop computer, a digital camera, a mobile telephone, a memory card reader, or an Internet-of-Things (IoT) enabled device, among various other types of systems. Host 485 can include a number of processing resources (e.g., one or more processors, microprocessors, or some other type of controlling circuitry) capable of accessing memory 486. The system can include separate integrated circuits, or both the host 485 and the memory device 486 can be on the same integrated circuit. For example, the host 485 may be a system controller of a memory system comprising multiple memory devices 486, with the system controller 487 providing access to the respective memory devices 486 by another processing resource such as a central processing unit (CPU).

In the example shown in FIG. 4, the host 485 is responsible for executing an operating system (OS) and/or various applications (e.g., processes) that can be loaded thereto (e.g., from memory device 486 via controller 487). The OS and/or various applications can be loaded from the memory device 486 by providing access commands from the host 485 to the memory device 486 to access the data comprising the OS and/or the various applications. The host 485 can also access data utilized by the OS and/or various applications by providing access commands to the memory device 486 to retrieve said data utilized in the execution of the OS and/or the various applications.

For clarity, the system has been simplified to focus on features with particular relevance to the present disclosure. The apparatus 470 can be a DRAM array comprising at least one memory cell having a digit line and body contact formed according to the techniques described herein. For example, the apparatus 470 can be an unshielded DL 4F2 array such as a 3D-DRAM memory array. The apparatus 470 can comprise memory cells arranged in rows coupled by word lines (which may be referred to herein as access lines or select lines) and columns coupled by digit lines (which may be referred to herein as sense lines or data lines). Although a single apparatus 470 is shown in FIG. 4, embodiments are not so limited. For instance, memory device 486 may include a number of apparatuses 470 (e.g., a number of banks of DRAM cells).

The memory device 486 includes address circuitry 496 to latch address signals provided over an interface 495. The interface 495 can include, for example, a physical interface employing a suitable protocol (e.g., a data bus, an address bus, and a command bus, or a combined data/address/command bus). Such protocol may be custom or proprietary, or the interface 495 may employ a standardized protocol, such as Peripheral Component Interconnect Express (PCIe), Gen-Z, CCIX, or the like. Address signals are received and decoded by a row decoder 497 and a column decoder 492 to access the apparatus 470. Data can be read from apparatus 470 by sensing voltage and/or current changes on the sense lines using sensing circuitry 491. The sensing circuitry 491 can comprise, for example, sense amplifiers that can read and latch a page (e.g., row) of data from the apparatus 470. The I/O circuitry 494 can be used for bidirectional data communication with the host 485 over the interface 495. The read/write circuitry 493 is used to write data to the apparatus 470 or read data from the apparatus 470. As an example, the circuitry 493 can comprise various drivers, latch circuitry, etc.

Control circuitry 499 decodes signals provided by the host 485. The signals can be commands provided by the host 485. These signals can include chip enable signals, write enable signals, and address latch signals that are used to control operations performed on the apparatus 470, including data read operations, data write operations, and data erase operations. In various embodiments, the control circuitry 499 is responsible for executing instructions from the host 485. The control circuitry 499 can comprise a state machine, a sequencer, and/or some other type of control circuitry, which may be implemented in the form of hardware, firmware, or software, or any combination of the three. In some examples, the host 485 can be a controller external to the memory device 486. For example, the host 485 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of," a "quantity of," or "a plurality of" something can refer to one or more of such things. For example, a number of or a quantity of memory cells can refer to one or more memory cells. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method comprising:

forming a plurality of dummy digit lines on a semiconductor substrate that are separated by a first set of vertical trenches, the dummy digit lines including a dummy digit line coupled to a bit line contact in the semiconductor substrate;

depositing a sacrificial insulating material in the first set of vertical trenches;

depositing a carbon material on the sacrificial insulating material;

removing a portion of the carbon material to form a second set of vertical trenches;

depositing an insulating fill material in the second set of vertical trenches;

removing a remainder of the carbon material to form a plurality of nitride material deposition spaces;

depositing a nitride material in the nitride material deposition spaces;

removing at least a portion of the semiconductor substrate to form plurality of cell contact deposition spaces extending through the nitride material and at least a portion of the height of the semiconductor substrate;

forming cell contacts in the cell contact deposition spaces;

removing the dummy digit lines to form a plurality of vertical openings;

removing at least a portion of the nitride material to form expanded vertical openings;

depositing a digit line insulating material in the expanded vertical openings to form digit line deposition spaces;

depositing a digit line material in the digit line deposition spaces to form digit lines; and depositing a cap material on the digit lines.

2. The method of claim 1, wherein forming the dummy digit lines further comprises:

depositing a silicon material;

depositing a temporary capping material on the silicon material; and removing a portion of the silicon material to form the dummy digit lines.

3. The method of claim 1, wherein removing at least a portion of the nitride material to form the expanded vertical openings further comprises removing some but not all of the nitride material.

4. The method of claim 3, wherein a remaining thickness of the nitride material is less than one nanometer.

5. The method of claim 1, wherein removing the at least portion of the nitride material to expand the vertical openings further comprises removing all of the nitride material.

6. The method of claim 1, wherein the digit line insulating material further comprises a low-K dielectric.

7. The method of claim 1, wherein the digit line material further comprises a metal digit line material.

8. The method of claim 7, wherein the metal digit line material further comprises tungsten, ruthenium, molybdenum, titanium, tantalum, cobalt, titanium nitride, tantalum nitride, tungsten silicide, cobalt silicide, tantalum silicide, doped silicon, doped germanium, or any combination thereof.

9. The method of claim 1, further comprising removing the dummy digit lines to form the vertical openings subsequent to forming the cell contacts.

10. A method comprising:

forming a plurality of dummy digit lines on a semiconductor substrate that are separated by a first set of vertical trenches, the dummy digit lines including a dummy digit line coupled to a bit line contact in the semiconductor substrate;

depositing a sacrificial insulating material in the first set of vertical trenches;

depositing a carbon material on the sacrificial insulating material;

removing a portion of the carbon material to form a second set of vertical trenches;

depositing an insulating fill material in the second set of vertical trenches;

removing the remaining carbon material to form a plurality of nitride material deposition spaces;

depositing a nitride material in the nitride material deposition spaces;

removing at least a portion of the nitride material to form cell contact deposition spaces extending through the nitride material and at least a portion of the height of the semiconductor substrate;

forming cell contacts in the cell contact deposition spaces;

subsequent to forming the cell contacts, removing the dummy digit lines to form vertical openings having a first width;

expanding the vertical openings to create expanded vertical openings with a second width that is greater than the first width;

depositing a digit line insulating material in the expanded vertical openings having the second width to form digit line deposition spaces;

depositing a digit line material in the digit line deposition spaces to form digit lines; and depositing a cap material on the digit lines.

11. The method of claim 10, wherein forming the digit line material in the digit line deposition space further comprises:

depositing the digit line material in the digit line deposition space; and removing a portion of the digit line material in the digit line deposition space to form the digit lines that are recessed a distance in the digit line deposition space.

12. The method of claim 11, further comprising removing the portion of the digit line material by performing a dry etch or a wet etch to selectively remove the portion of the digit line material.

13. The method of claim 10, wherein removing the portion of the carbon material further comprises etching the portion of the carbon material with a wet etchant or a dry etchant.

14. The method of claim 10, wherein expanding the vertical openings further comprises etching a sidewall of the vertical openings with a wet etchant or a dry etchant.

15. The method of claim 10, wherein any combination, or all of, the sacrificial insulating material, the insulating fill material, the nitride material, the cap material, and an insulating material base layer are the same material.

* * * * *